United States Patent
Hosaka et al.

(10) Patent No.: US 10,510,514 B2
(45) Date of Patent: Dec. 17, 2019

(54) GAS SUPPLY MECHANISM AND SEMICONDUCTOR MANUFACTURING APPARATUS

(71) Applicant: TOKYO ELECTRON LIMITED, Tokyo (JP)

(72) Inventors: Yuki Hosaka, Miyagi (JP); Yoshihiro Umezawa, Miyagi (JP); Mayo Uda, Miyagi (JP); Takashi Kubo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 353 days.

(21) Appl. No.: 15/508,054

(22) PCT Filed: Sep. 24, 2015

(86) PCT No.: PCT/JP2015/076922
§ 371 (c)(1),
(2) Date: Mar. 1, 2017

(87) PCT Pub. No.: WO2016/056390
PCT Pub. Date: Apr. 14, 2016

(65) Prior Publication Data
US 2017/0301518 A1    Oct. 19, 2017

(30) Foreign Application Priority Data

Oct. 8, 2014  (JP) .................. 2014-207207

(51) Int. Cl.
*F16K 3/08*    (2006.01)
*H01J 37/32*   (2006.01)
(Continued)

(52) U.S. Cl.
CPC .. *H01J 37/32449* (2013.01); *C23C 16/45587* (2013.01); *F16K 3/08* (2013.01);
(Continued)

(58) Field of Classification Search
CPC .......... F16K 3/08; F16K 31/041; H01J 37/32; C23C 16/45587
See application file for complete search history.

(56) References Cited

U.S. PATENT DOCUMENTS 3,888,459 A * 6/1975 Bubniak .................. F02D 9/10
                                                    251/208
5,968,593 A * 10/1999 Sakamoto ......... H01L 21/67109
                                                    118/715

(Continued)

FOREIGN PATENT DOCUMENTS

JP    S54-144578 A    11/1979
JP    2003-303788 A   10/2003
(Continued)

OTHER PUBLICATIONS

Honeywell Maxon Technical Catalog "Gas Electro-Mechanical Valves". 2016, pp. 1-36.*
(Continued)

*Primary Examiner* — Bret P Chen
(74) *Attorney, Agent, or Firm* — Studebaker & Brackett PC

(57) ABSTRACT

According to an aspect, a gas supply mechanism for supplying a gas to a semiconductor manufacturing apparatus is provided. The gas supply mechanism includes a pipe connecting a gas source and the semiconductor manufacturing apparatus to each other, and a valve which is provided on the pipe. The valve includes a plate rotatable about an axis, the axis extending in a plate thickness direction, and a housing provided along the plate without contacting the plate to accommodate the plate, the housing providing a gas supply path along with the pipe. A through hole is formed in the plate, the through hole penetrating the plate at a position on a circle which extends around the axis and intersects the gas supply path.

13 Claims, 15 Drawing Sheets

(51) Int. Cl.
*H01L 21/3065* (2006.01)
*C23C 16/455* (2006.01)
*F16K 31/04* (2006.01)
*H01L 21/67* (2006.01)

(52) U.S. Cl.
CPC ............ *F16K 3/085* (2013.01); *F16K 31/041* (2013.01); *H01J 37/3244* (2013.01); *H01L 21/3065* (2013.01); *H01L 21/67069* (2013.01); *H01J 37/32091* (2013.01); *H01J 37/32183* (2013.01); *H01J 2237/332* (2013.01); *H01J 2237/334* (2013.01)

(56) References Cited

U.S. PATENT DOCUMENTS

| | | | | |
|---|---|---|---|---|
| 6,227,299 | B1* | 5/2001 | Dennistoun | E21B 34/06 137/515 |
| 7,318,709 | B2* | 1/2008 | Koelzer | F04B 27/1009 417/441 |
| 8,460,253 | B2* | 6/2013 | Dugrot | A61M 5/00 604/256 |
| 2004/0182423 | A1* | 9/2004 | Nakao | B08B 7/00 134/22.1 |
| 2005/0263733 | A1* | 12/2005 | Horner | F16K 1/221 251/305 |
| 2011/0041921 | A1* | 2/2011 | Antonsen | F16K 1/12 137/1 |
| 2012/0193562 | A1* | 8/2012 | Takai | F02D 9/106 251/214 |
| 2017/0301568 | A1* | 10/2017 | Hosaka | H01J 37/32449 |

FOREIGN PATENT DOCUMENTS

| | | |
|---|---|---|
| JP | 2004-108764 A | 4/2004 |
| JP | 2013-197183 A | 9/2013 |

OTHER PUBLICATIONS

International Search Report issued in PCT/JP2015/076922; dated Dec. 8, 2015.

* cited by examiner

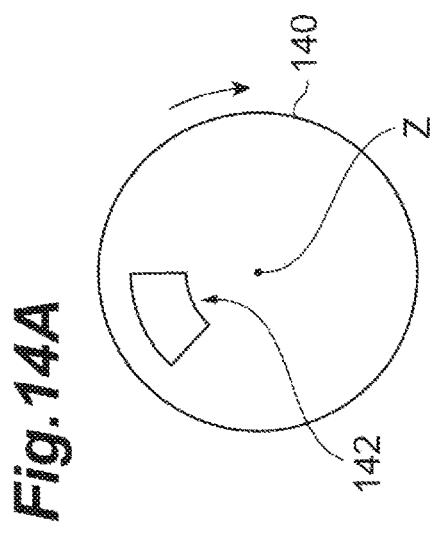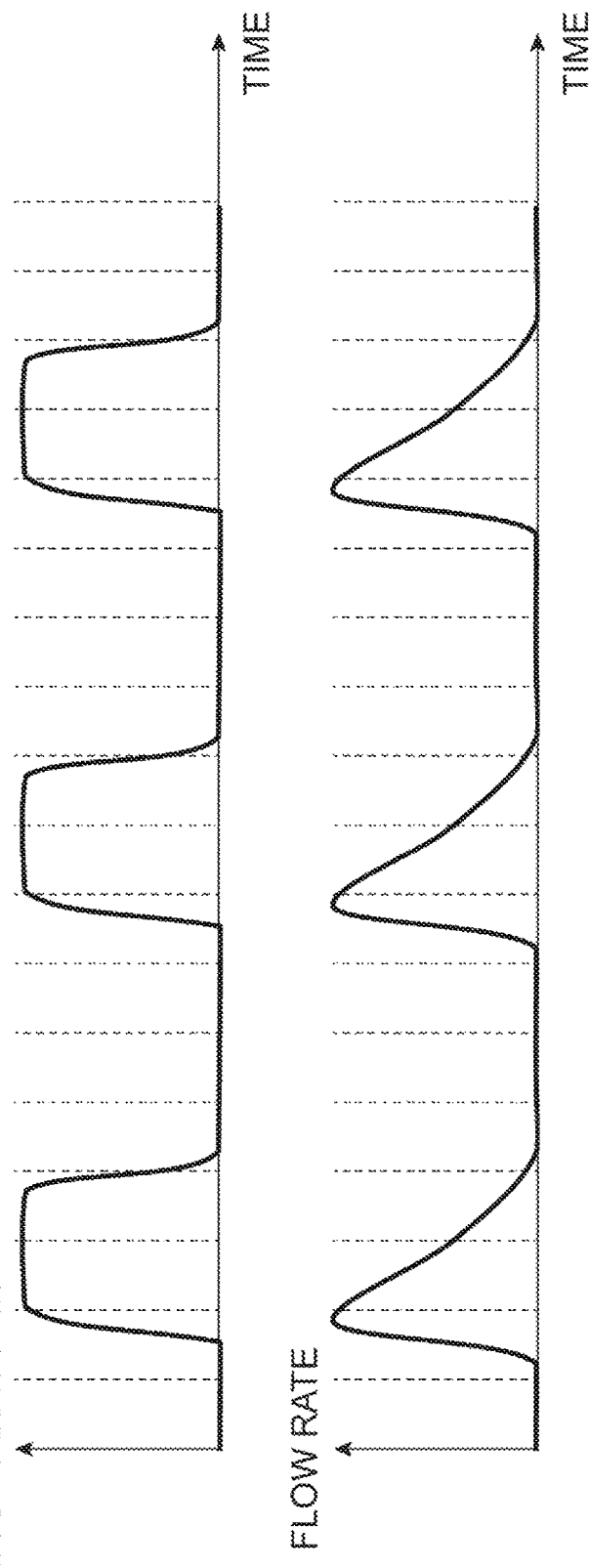

GAS SUPPLY MECHANISM AND SEMICONDUCTOR MANUFACTURING APPARATUS

TECHNICAL FIELD

Embodiments of the present invention relate to a gas supply mechanism and a semiconductor manufacturing apparatus.

BACKGROUND ART

In a production of a semiconductor device, various processing such as a film deposition or etching is performed on a workpiece so as to form a fine pattern on the workpiece. For example, such processing is performed by generating plasma of gas in a processing container and exposing the workpiece to the plasma. In recent years, there is a tendency that the pattern formed on the workpiece becomes finer. According, a more accurate processing technology is required. In order to form a fine pattern, a technology which alternately supplies gases different from each other to form a pattern on the workpiece is known.

For example, Patent Literature 1 discloses that a step of supplying a deposition gas to generate plasma of the deposition gas and a step of supplying an etching gas to generate plasma of the etching gas are alternately repeated to form a deep hole on a workpiece. In order to perform such processing, an apparatus disclosed in Patent Literature 1 includes a gas supply source, a shower head, a first gas supply line, and a second gas supply line. The etching gas supplied from the gas supply source is introduced into a gas diffusion chamber formed inside the shower head through the first gas supply line. The deposition gas supplied from the gas supply source is introduced into the gas diffusion chamber through the second gas supply line. A valve which switches between supplying and stopping supply of the gas with respect to the gas diffusion chamber is provided in each of the first gas supply line and the second gas supply line.

In the apparatus disclosed in Patent Literature 1, the deposition gas is supplied to the second gas supply line in a state where the valve of the second gas supply line is closed immediately before the gas supplied to the shower head is switched from the etching gas to the deposition gas. Accordingly, an internal pressure of the second gas supply line on the upstream side of the valve increases. As a result, a pressure difference between the inside (the inside on the upstream side) of the second gas supply line and the inside of the gas diffusion chamber is generated. In addition, when the gas supplied to the shower head is switched from the etching gas to the deposition gas, the deposition gas rapidly flows into the gas diffusion chamber by opening the valve of the second gas supply line. Moreover, the deposition gas is supplied to the first gas supply line in a state where the valve of the first gas supply line is closed immediately before the gas supplied to the shower head is switched from the deposition gas to the etching gas. Accordingly, an internal pressure of the first gas supply line on the upstream side of the valve increases. In addition, when the gas supplied to the shower head is switched from the deposition gas to the etching gas, the etching gas rapidly flows into the gas diffusion chamber by opening the valve of the first gas supply line. In this way, in the device disclosed in Patent Literature 1, a switching time between the process of generating plasma of the deposition gas and the process of generating plasma of the etching gas is shortened by causing the gas inside the gas supply line to rapidly flow into the diffusion chamber.

CITATION LIST

Patent Literature

[Patent Literature 1] Japanese Unexamined Patent Publication No. 2013-197183

SUMMARY OF INVENTION

Technical Problem

In order to shorten the switching time of gas, it is necessary to early stabilize a pressure inside a processing space in which a workpiece is processed. However, in the device disclosed in Patent Literature 1, in a case where the pressure difference between the inside of the gas supply line and the inside of the diffusion chamber of the shower head is generated, it is difficult to early stabilize the internal space of the processing container. Hereinafter, the reason will be described with reference to FIG. 15.

FIG. 15 is a graph showing a temporal change of a gas pressure inside a processing space when a gas is supplied to the processing space using the plasma processing apparatus similar to that of Patent Literature 1. FIG. 15A shows the temporal change of the gas pressure inside the processing space under condition in which gas is supplied to the processing space after the pressure difference between the gas supply line and the diffusion chamber is generated. In the condition, as shown in FIG. 15A, the gas pressure inside the processing space in an initial stage of the gas supply suddenly increases. However, thereafter, the gas pressure inside the processing space exceeds a target pressure (140 mTorr in the example of FIG. 15A). That is, if the pressure difference between the gas supply line and the diffusion chamber is generated, since the gas inside the gas supply line is excessively extruded toward the processing space due to the pressure difference, an overshoot in the control of the gas pressure is generated. When the overshoot is generated, a long period of time is required until the gas inside the processing container is discharged and the gas pressure is stabilized to be the target value. Accordingly, it is difficult to shorten the time until the gas pressure inside the processing space is stabilized.

Meanwhile, the inventors found that the pressure inside the processing space could be early stabilized to be the target pressure by supplying the gas into the processing container while switching opening and closing of the valve at a high speed. FIG. 15B shows a temporal change of a gas pressure inside the processing space under conditions in which the pressure difference between the gas supply line and the diffusion chamber is generated, and the gas is supplied to the processing space while opening and closing of the valve are switched at a high speed. In the conditions, as shown in FIG. 15B, it is possible to prevent occurrence of the overshoot, and as a result, it is confirmed that the gas pressure inside the processing space can be early stabilized.

From the above-described results, even in the device disclosed in Patent Literature 1, if gas is controlled to be supplied into the processing container while opening and closing the valve of the gas supply line at a high speed, it is considered that the switching time of the gas can be shortened. However, in a general diaphragm type valve, endurance is low, and the valve may be damaged at a short period of time due to wear or the like of a connection portion if opening and closing performed at a high frequency. Accordingly, in the device disclosed in Patent Literature 1, if a control is performed such that the valve is opened and closed at a high frequency, there is a concern that an operation rate of the device may be decreased.

Therefore, in the present technical field, it is required to provide a gas supply mechanism and a semiconductor manufacturing apparatus in which the pressure inside the processing space can be early stabilized and high endurance is provided.

Solution to Problem

According to an aspect, a gas supply mechanism for supplying a gas to a semiconductor manufacturing apparatus is provided. The gas supply mechanism includes a pipe connecting a gas source and the semiconductor manufacturing apparatus to each other, and a valve provided on the pipe, the valve includes a plate rotatable about an axis which extends in a plate thickness direction, and a housing provided along the plate without contacting the plate to accommodate the plate, the housing providing a gas supply path along with the pipe, and a through hole is formed in the plate, the through hole penetrating the plate at a position on a circle which extends around the axis and intersects the gas supply path.

In the gas supply mechanism according to the aspect, since the gas can pass through the valve via the through hole when the through hole of the plate is positioned on the gas supply path, conductance of the gas supply path increases. Meanwhile, since the plate inhibits the flow of the gas when the through hole is not positioned on the gas supply path, the conductance of the gas supply path decreases. That is, in the gas supply mechanism, the conductance of the gas supply path is changed according to the change of the position of the through hole with respect to the gas supply path. Accordingly, in the gas supply mechanism, the same function as opening and closing the valve at a high speed is exerted by rotating the plate. Therefore, according to the gas supply mechanism, it is possible to early stabilize the pressure inside the processing space of the semiconductor manufacturing apparatus. Moreover, since the plate is provided without contacting the housing, high endurance is provided.

In an embodiment, a drive unit configured to rotate the plate, and a control unit configured to control the drive unit to control a rotation angle of the plate may be further provided. In addition, in an embodiment, the drive unit may include a motor configured to rotate the plate, and the motor may include an output shaft, the output shaft extending on the axis and being connected to the plate. According to this configuration, since the plate can be rotated at a high speed, it is possible to early stabilize the pressure inside the processing space of the semiconductor manufacturing apparatus.

In an embodiment, the drive unit may include a tubular stator and a tubular rotor provided coaxially with the stator inside the stator, and the plate may be provided in an inner hole of the rotor and may be connected to the rotor. According to this configuration, since it is not necessary to insert the output shaft of the motor from the outside of the housing into the inside of the housing, it is possible to improve sealability of the housing.

In an embodiment, a width of the through hole in a direction orthogonal to the axis may vary in a circumferential direction with respect to the axis. According to this configuration, it is possible to temporally change a flow rate of the gas which passes through the valve.

Advantageous Effects of Invention

It is possible to provide a gas supply mechanism and a semiconductor manufacturing apparatus in which the pressure inside the processing space can be early stabilized and having high endurance.

BRIEF DESCRIPTION OF DRAWINGS

FIG. 14A is a plan view showing a still another modification example of the plate, and FIG. 14B is a graph showing a temporal change of a cross-sectional area of a flow path on the same plane as that of the plate and a temporal change of a flow rate of a gas supplied to a processing space.

DESCRIPTION OF EMBODIMENTS

Hereinafter, various embodiments will be described in detail with reference to the drawings. In addition, the same reference symbols are assigned to the same portions or the corresponding portions in each drawing.

Figure 1:
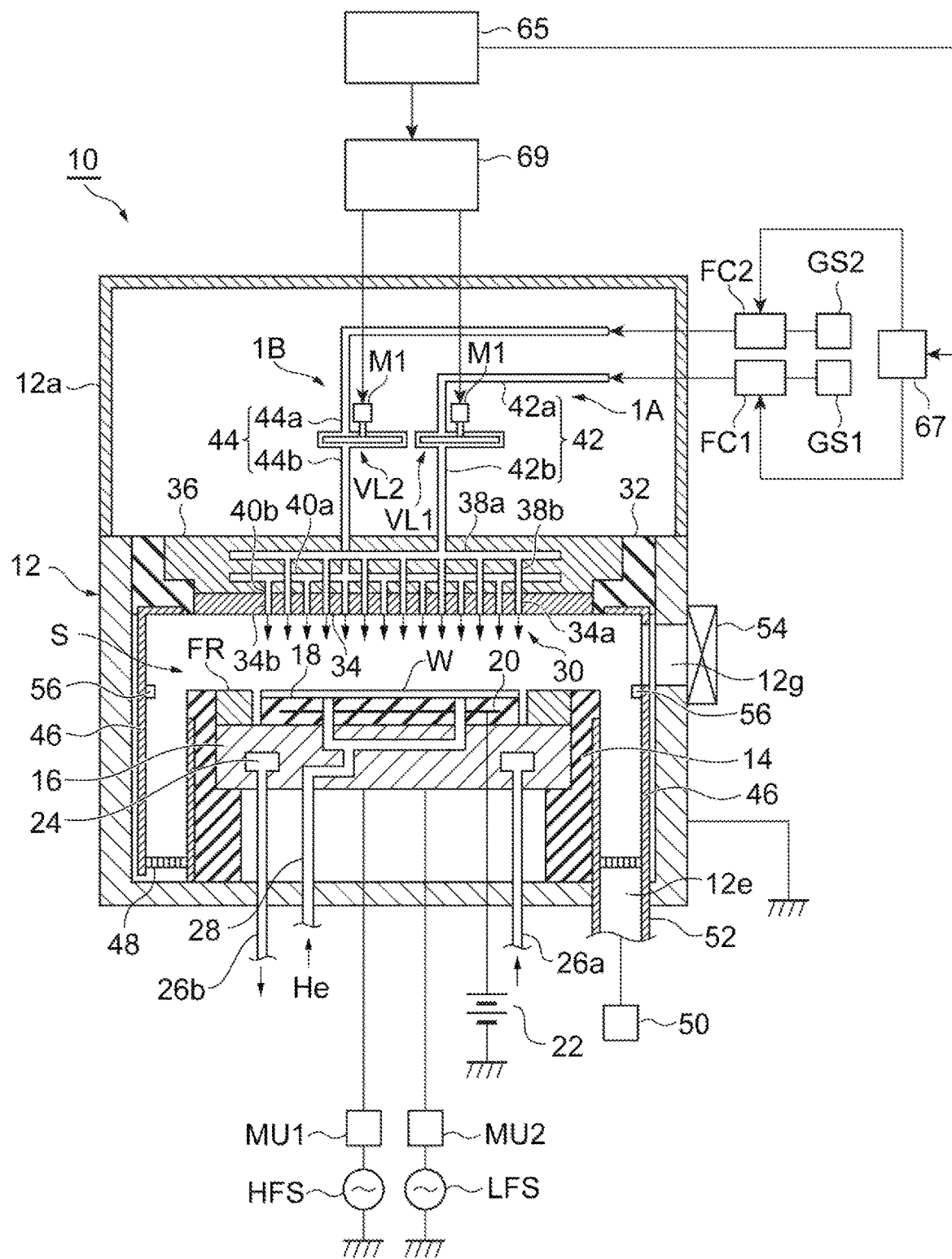
FIG. 1 is a sectional view schematically showing a plasma processing apparatus according to an embodiment.

FIG. 1 is a view schematically showing a semiconductor manufacturing apparatus according to an embodiment. FIG. 1 schematically shows a sectional structure of a plasma processing apparatus 10 which is an example of the semiconductor manufacturing apparatus. The plasma processing apparatus 10 is a capacity coupling type parallel plate plasma etching apparatus, and includes an substantially cylindrical processing container 12. For example, the processing container 12 is configured of aluminum and the surface of the processing container 12 is anodized. The processing container 12 is grounded for safety.

A transfer in/out port 12g of a workpiece W is provided on the side wall of the processing container 12. The transfer in/out port 12g can be opened and closed by a gate valve 54. Moreover, a ground conductor 12a which extends upward from the side wall of the processing container 12 is mounted on the upper end of the side wall of the processing container 12. The ground conductor 12a has an approximately cylindrical shape.

A cylindrical support portion 14 which is configured of an insulating material is disposed on a bottom portion of the processing container 12. The support portion 14 supports a lower electrode 16 on an inner wall surface of the support portion 14. For example, the lower electrode 16 is configured of metal such as aluminum and has an approximate disk shape.

A first high frequency power source HFS is connected to lower electrode 16 via a matching unit MU1. The first high frequency power source HFS is a power source which generates a high frequency power for generating plasma, and generates frequency of 27 to 100 MHz, for example, high frequency power of 40 MHz. The matching unit MU1 has a circuit for matching output impedance of the first high frequency power source HFS with input impedance of a load side (lower electrode 16 side).

In addition, a second high frequency power source LFS is connected to the lower electrode 16 via a matching unit MU2. The second high frequency power source LFS generates high frequency power (high frequency bias power) to attract ions to the workpiece and supplies the high frequency bias power to the lower electrode 16. The frequency of the high frequency bias power is frequency within a range from 400 kHz to 13.56 MHz, and for example, is 3 MHz. The matching unit MU2 has a circuit for matching output impedance of the second high frequency power source LFS with input impedance of the load side (lower electrode 16 side).

An electrostatic chuck 18 is provided on the lower electrode 16. The electrostatic chuck 18 configures a placement table for supporting the workpiece W along with the lower electrode 16. The electrostatic chuck 18 has a structure in which an electrode 20 which is a conductive film is disposed between a pair of insulation layers or a pair of insulation sheets. A direct-current power source 22 is electrically connected to the electrode 20. The electrostatic chuck 18 can attract and hold the workpiece W by an electrostatic force such as a Coulomb force generated by direct voltages from the direct-current power source 22.

A focus ring FR is disposed around the electrostatic chuck 18 on the upper surface of the lower electrode 16. The focus ring FR is provided to improve uniformity of etching. The focus ring FR is configured of a material which is appropriately selected according to the material of the layer to be etched, and for example, can be formed of silicon, quartz, or the like.

A refrigerant chamber 24 is provided inside the lower electrode 16. A refrigerant having a predetermined temperature, for example, a cooling water is circulation-supplied to the refrigerant chamber 24 via pipes 26a and 26b from a chiller unit provided on the outside. The temperature of the workpiece W which is placed on the electrostatic chuck 18 is controlled by controlling the temperature of the refrigerant which is circulated in this way.

Moreover, a gas supply line 28 is provided in the plasma processing apparatus 10. The gas supply line 28 supplies a heat-transfer gas, for example, He gas from a heat-transfer gas supply mechanism to a portion between the upper surface of the electrostatic chuck 18 and the rear surface of the workpiece W.

In an embodiment, the plasma processing apparatus 10 further includes a deposit shield 46. The deposit shield 46 is detachably provided along the inner wall of the processing container 12. The deposit shield 46 is also provided on the outer periphery of the support portion 14. The deposit shield 46 prevents etching by-products (deposits) from being attached to the processing container 12, and for example, can be configured by coating ceramics such as $Y_2O_3$ to an aluminum material.

In addition, a conductive member (GND block) 56 is provided on the inner wall of the processing container 12. The conductive member 56 is attached to the inner wall of the processing container 12 so as to be positioned at approximately the same height as that of the workpiece W in the height direction. The conductive member 56 is DC-connected to the ground and exerts an abnormal discharge prevention effect.

In addition, an exhaust plate 48 is provided between the support portion 14 and the inner wall of the processing container 12 on the bottom portion side of the processing container 12. For example, the exhaust plate 48 can be configured by coating ceramics such as $Y_2O_3$ to an aluminum material. An exhaust port 12e is provided on the processing container 12 below the exhaust plate 48. An exhaust device 50 is connected to the exhaust port 12e via an exhaust pipe 52. The exhaust device 50 includes a vacuum pump such as a turbo molecular pump and can decrease the pressure inside the processing container 12 to a desired degree of vacuum.

In addition, the plasma processing apparatus 10 further includes an upper electrode 30. The upper electrode 30 is disposed above the lower electrode 16 so as to face the lower electrode 16. The lower electrode 16 and the upper electrode 30 are provided so as to be approximately parallel to each other. A processing space S for performing plasma etching on the workpiece W therein is defined between the upper electrode 30 and the lower electrode 16.

The upper electrode 30 is supported by the upper portion of the processing container 12 via an insulation shield member 32. The upper electrode 30 can include an electrode plate 34 and an electrode support 36. The electrode plate 34 faces the processing space S and defines a plurality of gas ejection holes 34a and a plurality of gas ejection holes 34b. The electrode plate 34 can be formed of a low-resistance conductor or semiconductor having small joule heat.

The electrode support 36 detachably supports the electrode plate 34, and for example, can be formed of a conductive material such as aluminum. The electrode support 36 can have a water cooling structure. In addition, a first gas diffusion chamber 38a and a second gas diffusion chamber 40a are provided inside the electrode support 36. A plurality of gas communication holes 38b which communicate with the gas ejection holes 34a extend downward from the first gas diffusion chamber 38a. In addition, a plurality of gas communication holes 40b which communicate with the gas ejection holes 34b extend downward from the second gas diffusion chamber 40a.

A first gas source GS1 is connected to the first gas diffusion chamber 38a via a first gas supply mechanism 1A and a first flow rate controller FC1. For example, the first gas source GS1 is a gas source of a first gas for etching the workpiece W. The upstream side of the first flow rate controller FC1 is connected to the first gas source GS1, and the downstream side of first flow rate controller FC1 is connected to the first gas supply mechanism 1A. The first flow rate controller FC1 is configured to control the supply and the supply stop of the first gas from the first gas source GS1 with respect to the first pipe 42 of the first gas supply mechanism 1A and to control the flow rate of the first gas supplied to the first pipe 42. The first flow rate controller FC1 can include a valve and a mass flow controller.

Moreover, a second gas source GS2 is connected to the second gas diffusion chamber 40a via a second gas supply mechanism 1B and a second flow rate controller FC2. For example, the second gas source GS2 is a gas source of a second gas having deposition property with respect to the surface of the workpiece W. The upstream side of the second flow rate controller FC2 is connected to the second gas source GS2, and the downstream side of the second flow rate controller FC2 is connected to the second gas supply mechanism 1B. The second flow rate controller FC2 is configured to control the supply and the supply stop of the second gas from the second gas source GS2 with respect to the second pipe 44 of the second gas supply mechanism 1B and to control the flow rate of the second gas supplied to the second pipe 44. The second flow rate controller FC2 can include a valve and a mass flow controller.

The gas control unit 67 is connected to the first flow rate controller FC1 and the second flow rate controller FC2. The gas control unit 67 transmits a control signal of each of the first flow rate controller FC1 and the second flow rate controller FC2, and controls the first flow rate controller FC1 and the second flow rate controller FC2. Specifically, the gas control unit 67 transmits the control signal to the first flow rate controller FC1 to control the supply and the supply stop of the first gas from the first gas source GS1 and control the flow rate of the first gas. In addition, the gas control unit 67 transmits the control signal to the second flow rate controller FC2 to control the supply and the supply stop of the second gas from the second gas source GS2 and control the flow rate of the second gas.

Hereinafter, the first gas supply mechanism 1A and the second gas supply mechanism 1B will be described with reference to FIGS. 1 to 4. The first gas supply mechanism 1A includes a first pipe 42 and a first valve VL1. The second gas supply mechanism 1B includes a second pipe 44 and a second valve VL2.

The first pipe 42 connects the first gas source GS1 and the first gas diffusion chamber 38a to each other. Specifically, the first pipe 42 is connected to the downstream side of the first flow rate controller FC1, and is connected to the upstream side of the first gas diffusion chamber 38a. In addition, the second pipe 44 connects the second gas source GS2 and the second gas diffusion chamber 40a to each other. Specifically, the second pipe 44 is connected to the downstream side of the second flow rate controller FC2, and is connected to the upstream side of the second gas diffusion chamber 40a. The first valve VL1 and the second valve VL2 are respectively provided on the first pipe 42 and the second pipe 44. The first valve VL1 has a function which increases and decreases the conductance of first gas supply path provided by the first pipe 42, and the second valve VL2 has a function which increases and decreases the conductance of the second gas supply path provided by the second pipe 44.

Figure 2A:
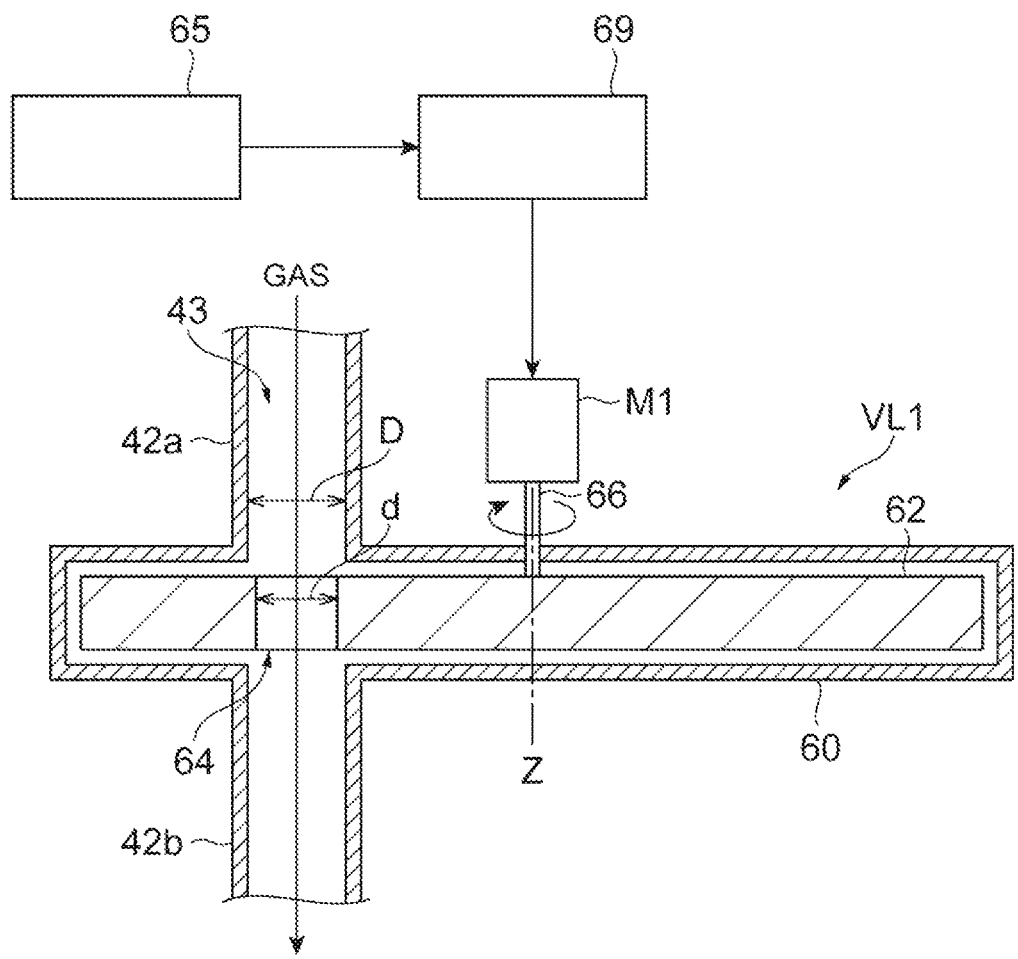
FIG. 2A is a sectional view of a valve which is set to a first operation mode and FIG. 2B is a plan view of a plate shown in FIG. 2A.

FIG. 2A is a sectional view schematically showing the first valve VL1. As shown in FIG. 2A, the first valve VL1 includes a housing 60 and a plate 62 and is provided on the first pipe 42. As shown in FIG. 2A, the first pipe 42 includes an upstream portion 42a which is provided on the upstream side of the housing 60 and a downstream portion 42b which is provided on the downstream side of the housing. The housing 60 is connected to the upstream portion 42a and the downstream portion 42b. The housing 60 defines an internal space which is continued to the first gas supply path 43 provided by the first pipe 42, and partially provides the first gas supply path 43 between the upstream portion 42a and the downstream portion 42b.

Moreover, the housing 60 accommodates the plate 62 in the internal space and is provided along the plate 62 without contacting the plate 62. The housing 60 may be provided via a gap of 0.5 mm or less with respect to the plate 62. Since the gap between the inner wall of the housing 60 and the plate 62 is 0.5 mm or less, it is possible to suppress a gas supplied from the upstream portion 42a of the first pipe 42 into the housing 60 from flowing to the downstream portion 42b without going through a through hole 64 described below.

Figure 2B:
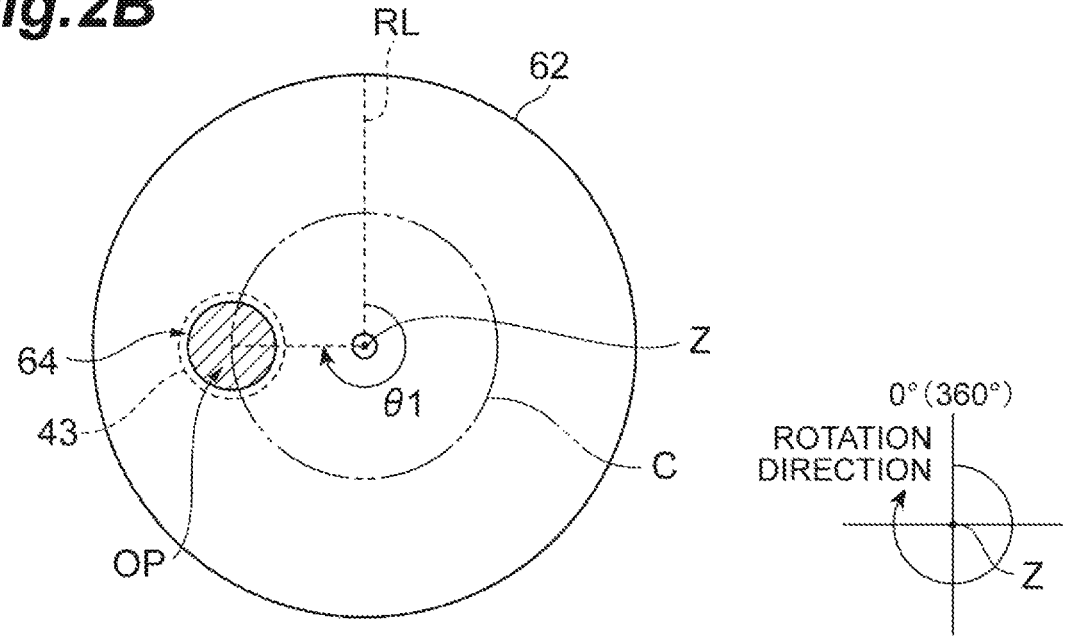

FIG. 2B is a plan view of the plate 62. The plate 62 has a disk shape and is configured to be rotatable about an axis Z which extends in a plate thickness direction. As shown in FIGS. 2A and 2B, the through hole 64 is formed in the plate 62. The through hole 64 is formed at a position on a circle C. The circle C is a circle which extends around the axis Z and intersects the gas supply path 43. That is, it is possible to adjust a relative position of the through hole 64 with respect to the first gas supply path 43 by the plate 62 rotating about the axis Z.

In an embodiment, the through hole 64 has a circular plane shape which is defined by a diameter d. A relationship between the diameter d of the through hole 64 and a diameter D of the first gas supply path 43 can be appropriately set. For example, in a case where the diameter d of the through hole 64 is equal to or more than the diameter D of the first gas supply path 43, the first valve VL1 can supply the first gas which flows through the first gas supply path 43 to the first gas diffusion chamber 38a without decreasing the conductance of the first gas supply path 43. Meanwhile, in a case where the diameter d of the through hole 64 is smaller than the diameter D of the first gas supply path 43, the first valve VL1 can function as a throttle valve which decreases the conductance of the first gas supply path 43.

In addition, a motor M1 is connected to the plate 62 as a drive unit which rotates the plate 62. The motor M1 has an output shaft 66. The output shaft 66 extends on the axis Z. That is, the center axis of the output shaft 66 coincides with the axis Z. The output shaft 66 penetrates the housing 60 and is connected to the plate 62. That is, the output shaft 66 is connected to the plate 62 such that the center of the plate 62 is positioned on the center axis of the output shaft 66. A seal material may be provided between the output shaft 66 and the housing 60. Accordingly, air tightness of the housing 60 is improved.

A motor control unit 69 is connected to the motor M1. The motor M1 can control the rotation angle and the rotation of the plate 62 by a control signal from the motor control unit 69. The motor control unit 69 can switch an operation mode of the first valve VL1 to any one operation mode of first to fourth operation modes by controlling the motor M1 of the first valve VL1. It should be note that the first to third modes are modes in each of which the rotation angle of the plate 62 is controlled to a specific rotation angle at each mode, and the fourth mode is a mode in which the plate 62 rotates at a constant angular speed. Hereinafter, the first to fourth modes will be described in detail.

First Operation Mode

First, the first operation mode will be described with reference to FIGS. 2A and 2B. The first operation mode is an operation mode in which the motor control unit 69 controls the motor M1 to set the rotation angle of the plate 62 such that the conductance of the first gas supply path 43 is highest among the first to third operation modes. As shown in FIGS. 2A and 2B, in the first operation mode, the plate 62 is rotated such that an overlapping area between the through hole 64 and the first gas supply path 43 becomes the maximum when viewed in the direction of the axis Z, and the rotation angle of the plate 62 is set to a first rotation angle θ1. In the example shown in FIGS. 2A and 2B, the rotation angle of the plate 62 is set to the first rotation angle θ1 such that the center axis of the through hole 64 and the center axis of the first gas supply path 43 coincides with each other. It should be noted that the rotation angle is an angle between a line which connects the center axis of the through hole 64 and the axis Z to each other and a reference line RL which extends in a radiation direction with respect to the axis Z, and is an angle in which a clockwise direction with respect to the axis Z is a positive direction.

As shown in FIGS. 2A and 2B, in the first operation mode, the overlapping area (in FIGS. 2A and 2B, an area of a region hatched by a reference numeral OP) between the through hole 64 and the first gas supply path 43 when viewed in the direction of the axis Z becomes the maximum, and most of the gas which flows through the first pipe 42 passes through the through hole 64 of the plate 62. In addition, the gas which passes through the through hole 64 is supplied to the processing space S via the first gas diffusion chamber 38a, the gas communication hole 38b, and the gas ejection hole 34a.

Second Operation Mode

Figure 3A:
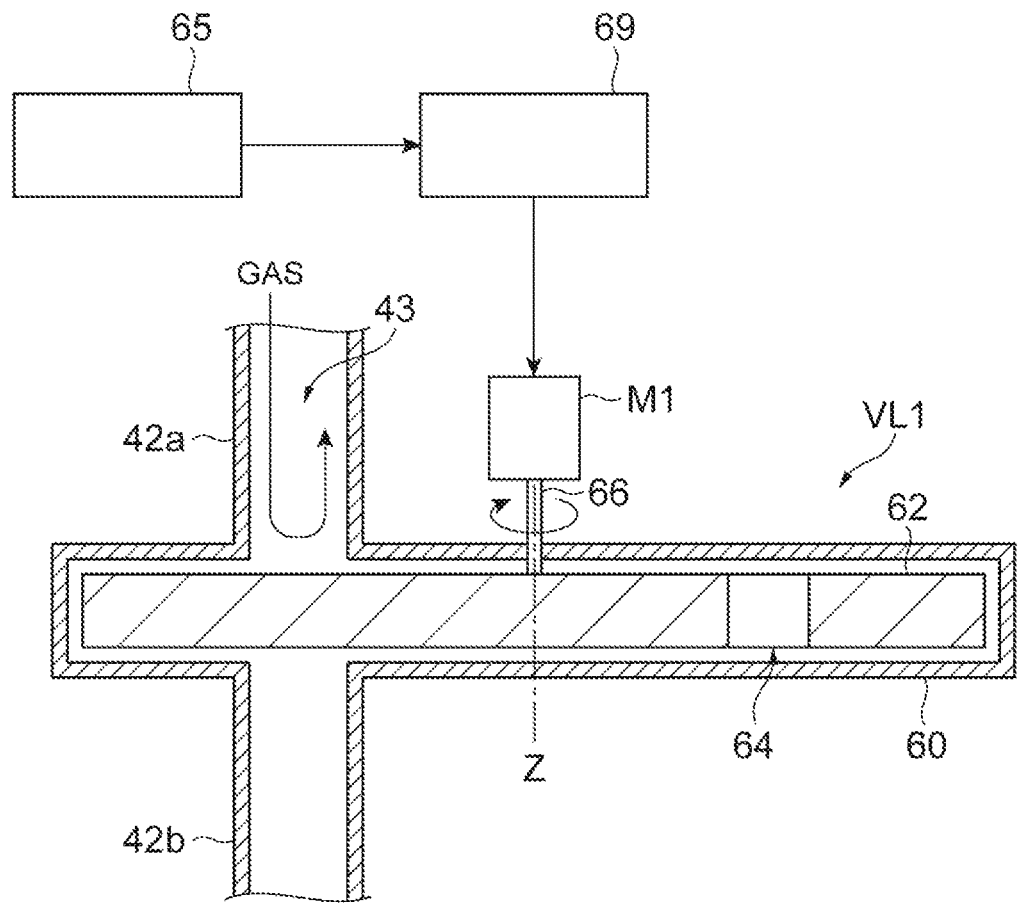
FIG. 3A is a sectional view of the valve which is set to a second operation mode and FIG. 3B is a plan view of the plate shown in FIG. 3A.
Figure 3B:
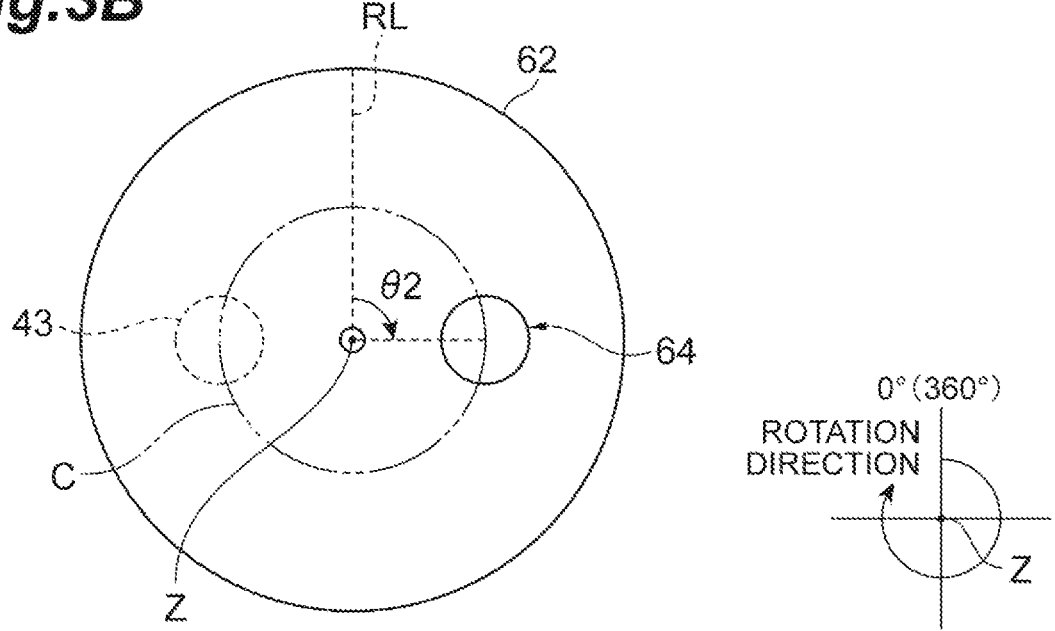

Next, the second operation mode will be described with reference to FIG. 3. The FIG. 3A is a sectional view showing the first valve VL1 which is set to the second operation mode and FIG. 3B is a plan view of the plate 62 of FIG. 3A. The second operation mode is an operation mode in which the motor control unit 69 controls the motor M1 to set the rotation angle of the plate 62 such that the conductance of the first gas supply path 43 is lowest among the first to third operation modes. In the second operation mode, the through hole 64 is disposed at a position which is deviated from the first gas supply path 43.

In the second operation mode, the plate 62 is rotated to set the rotation angle of the plate 62 to a second rotation angle θ2. For example, the second rotation angle θ2 is an angle of 180° in the circumferential direction with respect to the first rotation angle θ1, and is a rotation angle of the plate 62 which is disposed at a position at which the through hole 64 is farthest separated from the first gas supply path 43.

As shown in FIGS. 3A and 3B, in the second operation mode, since the through hole 64 is disposed at the position at which the through hole 64 is separated from the first gas supply path 43, the through hole 64 and the first gas supply path 43 do not overlap each other when viewed in the direction of the axis Z. That is, in the second operation mode, the plate 62 is positioned on the first gas supply path 43. Accordingly, in the second operation mode, the flow of the gas in the first gas supply path 43 is blocked. Therefore, in the second operation mode, the conductance of the first gas supply path 43 decreases.

Moreover, if the first gas flows to the upstream side of the first valve VL1 when the first valve VL1 is set to the second operation mode, the first gas stays in the upstream portion 42a of the first pipe 42. As a result, the internal pressure of the upstream portion 42a increases. Therefore, if the first valve VL1 is set to the second operation mode, a pressure difference is generated between the upstream portion 42a of the first pipe 42 and the processing space S.

Third Operation Mode

Figure 4A:
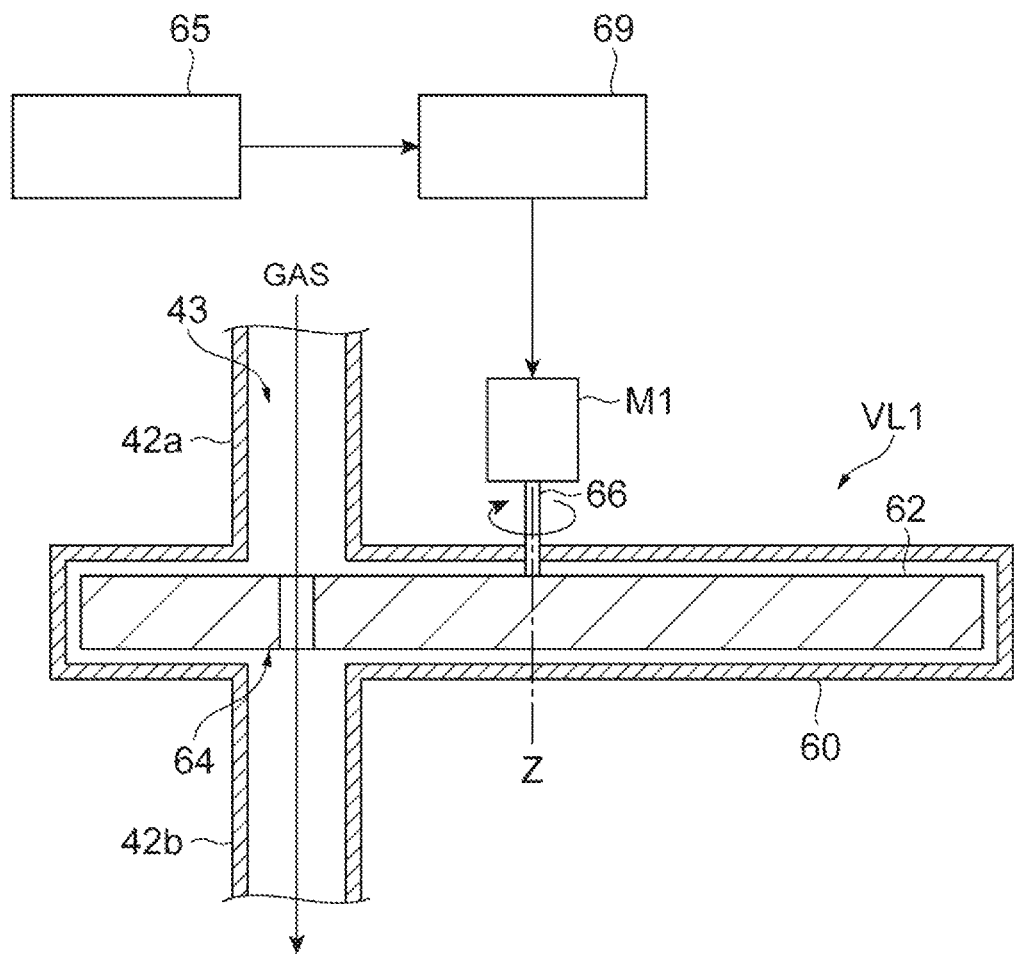
FIG. 4A is a sectional view of the valve which is set to a third operation mode and FIG. 4B is a plan view of the plate shown in FIG. 4A.
Figure 4B:
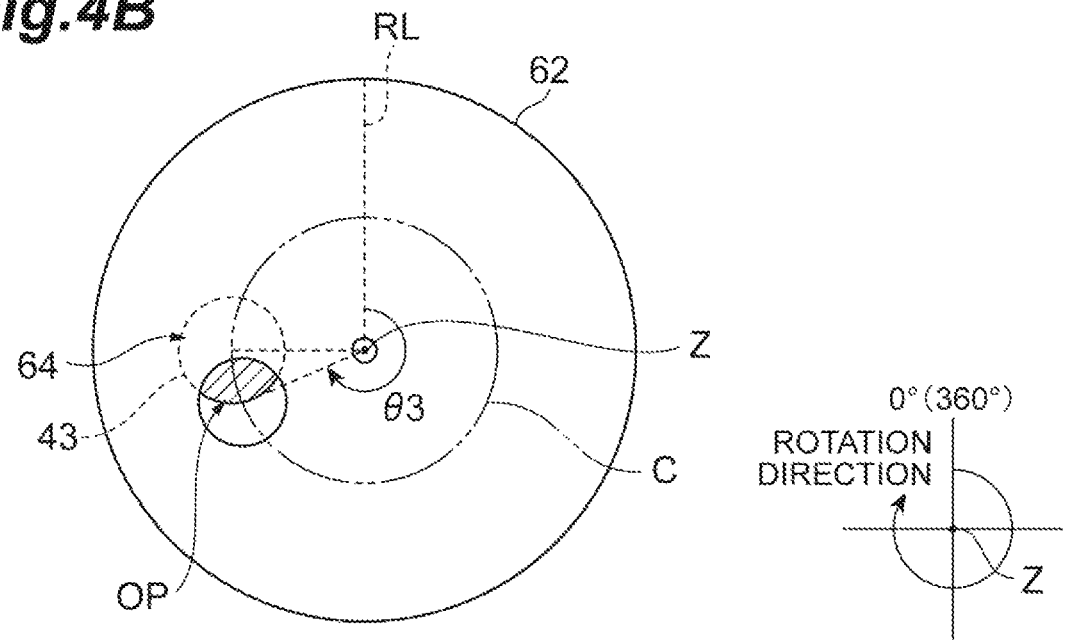

Next, the third operation mode will be described with reference to FIG. 4. The FIG. 4A is a sectional view showing the first valve VL1 which is set to the third operation mode and FIG. 4B is a plan view of the plate 62 of FIG. 4A. The third operation mode is an operation mode in which the motor control unit 69 controls the motor M1 to set the rotation angle of the plate 62 such that the conductance of the gas supply path 43 is lower than that of the first operation mode and is higher than that of the second operation mode. In the third operation mode, the rotation angle of the plate 62 is set to a third rotation angle θ3 such that only a portion of the through hole 64 is positioned on the first gas supply path 43.

Specifically, as shown in FIGS. 4A and 4B, in the third operation mode, the first gas supply path 43 is partially blocked by the plate 62. Accordingly, the overlapping area (in FIG. 4, an area of a region hatched by a reference numeral OP) between the through hole 64 and the first gas supply path 43 when viewed from the direction of the axis Z is smaller than the overlapping area (in FIGS. 2A and 2B, the area of the region hatched by the reference numeral OP) in the first operation mode. Accordingly, compared to the first operation mode, in the third operation mode, the conductance of the first gas supply path 43 decreases.

Fourth Operation Mode

The fourth operation mode is a mode in which the motor control unit 69 controls the motor M1 to rotate the plate 62 at a constant angular speed. In the fourth mode, the through hole 64 is positioned on the first gas supply path 43 during a constant period. Accordingly, the conductance of the first gas supply path 43 is periodically changed. Therefore, in the fourth operation mode, the gas is intermittently supplied to the processing space S. In addition, a time interval in which the gas is supplied can be adjusted by changing a rotating speed of the plate 62. Hereinafter, as a specific example, a temporal change of the flow rate of the gas which is supplied to the processing space S via the first pipe 42 when the motor control unit 69 rotates the plate 62 of the first valve VL1 at a constant angular speed will be described.

Figure 5:
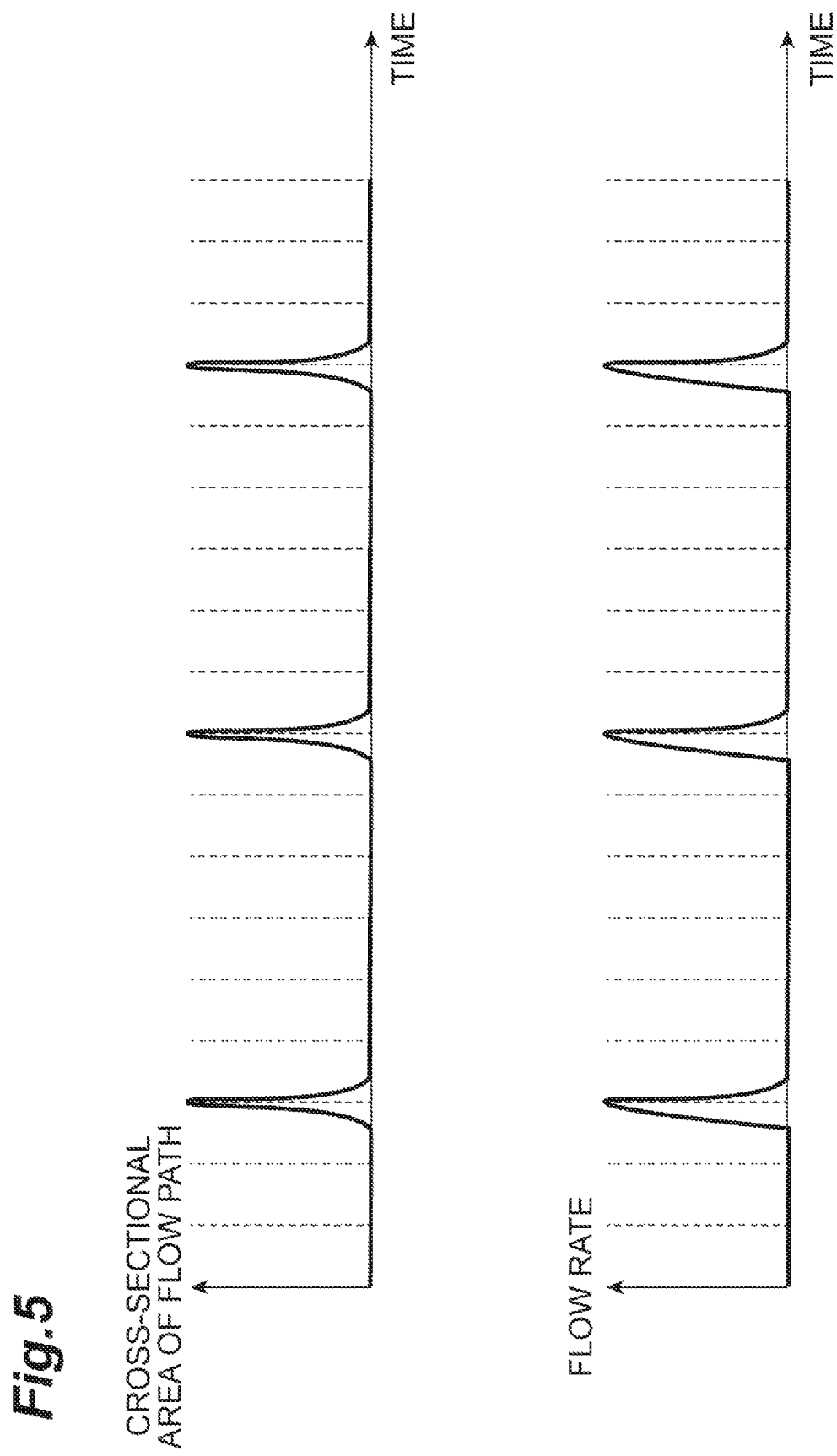
FIG. 5 is a graph showing a temporal change of a cross-sectional area of a flow path on the same plane as that of the plate and a temporal change of a flow rate of a gas supplied to a processing space.

FIG. 5 is a graph showing a temporal change of a cross-sectional area of the first gas supply path 43 on the same plane as that of the plate 62 and a temporal change of the flow rate of the gas supplied to the processing space S when the plate 62 rotates a constant angular speed. In addition, the first gas is supplied from the first gas source GS1 to the first pipe 42, and the diameter d of the through hole 64 is the same as the diameter D of the gas supply path 43 of the first pipe 42.

If the plate 62 rotates at a constant angular speed, the through hole 64 of the plate 62 passes through the first gas supply path 43 at a constant time interval. Accordingly, as shown in FIG. 5, the cross-sectional area of the flow path on the same plane as that of the plate 62 increases when the through hole 64 is disposed on the gas supply path 43, and the cross-sectional area decreases when the through hole 64 is not disposed on the gas supply path 43. As a result, the conductance of the first gas supply path 43 periodically increases and decreases. Accordingly, as shown in FIG. 5, the first gas is intermittently supplied to the processing space S.

Hereinbefore, the components and the first to fourth operation modes with respect to the first valve VL1 are described. Similarly to the first valve VL1, the second valve VL2 also includes the housing 60, the plate 62, and the motor M1. Moreover, the second valve VL2 can be operated by the first to fourth operation modes according to the control of the motor M1 of the second valve VL2 performed by the motor control unit 69, and it is possible to adjust the conductance of the second gas supply path which is provided by the second pipe 44.

Return to descriptions of FIG. 1, the plasma processing apparatus 10 further includes the main control unit 65. The main control unit 65 is a computer which includes a processor, a storage unit, an input unit, a display unit, or the like. In the main control unit 65, an operator can perform an input operation or the like of a command so as to manage the plasma processing apparatus 10 using the input unit, and can visualize and display an operation situation of the plasma processing apparatus 10 using the display unit. In addition, the main control unit 65 can collectively control each portion of the plasma processing apparatus 10 according to a recipe stored in the storage unit. For example, the main control unit 65 controls the gas control unit 67 and the motor control unit 69 such that the first flow rate controller FC1, the second flow rate controller FC2, the first valve VL1, and the second valve VL2 work together. It should be noted that a control flow in which the first flow rate controller FC1, the second flow rate controller FC2, the first valve VL1, and the second valve VL2 work together will be described in detail along with descriptions of a gas supply method according to an embodiment described below.

In the plasma processing apparatus 10, the first gas is supplied from the first gas source GS1 into the processing container 12 via the first gas supply mechanism 1A. In addition, the second gas is supplied from the second gas source GS2 into the processing container 12 via the second gas supply mechanism 1B. The first gas and the second gas can be alternately supplied into the processing container 12. Moreover, since high frequency power for generating plasma is applied to the lower electrode 16, a high frequency electric field is generated between the lower electrode 16 and the upper electrode 30. The plasma of the gas supplied to the processing space S is generated by the high frequency electric field. Accordingly, the workpiece W is processed by the plasma of the gas.

In addition, each of the above-described first gas supply mechanism 1A and second gas supply mechanism 1B can increase and decrease the conductance of each of the first valve VL1 and the second valve VL2 by changing the rotation angle of the plate 62. In addition, in a case where the plate 62 rotates, the first valve VL1 and the second valve VL2 exert the same function by opening and closing the valves at a high speed. Therefore, according to the first gas supply mechanism 1A and the second gas supply mechanism 1B, it is possible to early stabilize the pressure inside the processing space S. Moreover, in the first gas supply mechanism 1A and the second gas supply mechanism 1B, the plate 62 is provided without contacting the housing 60. Accordingly, it is possible to increase endurance of each of the first gas supply mechanism 1A and the second gas supply mechanism 1B.

Figure 6:
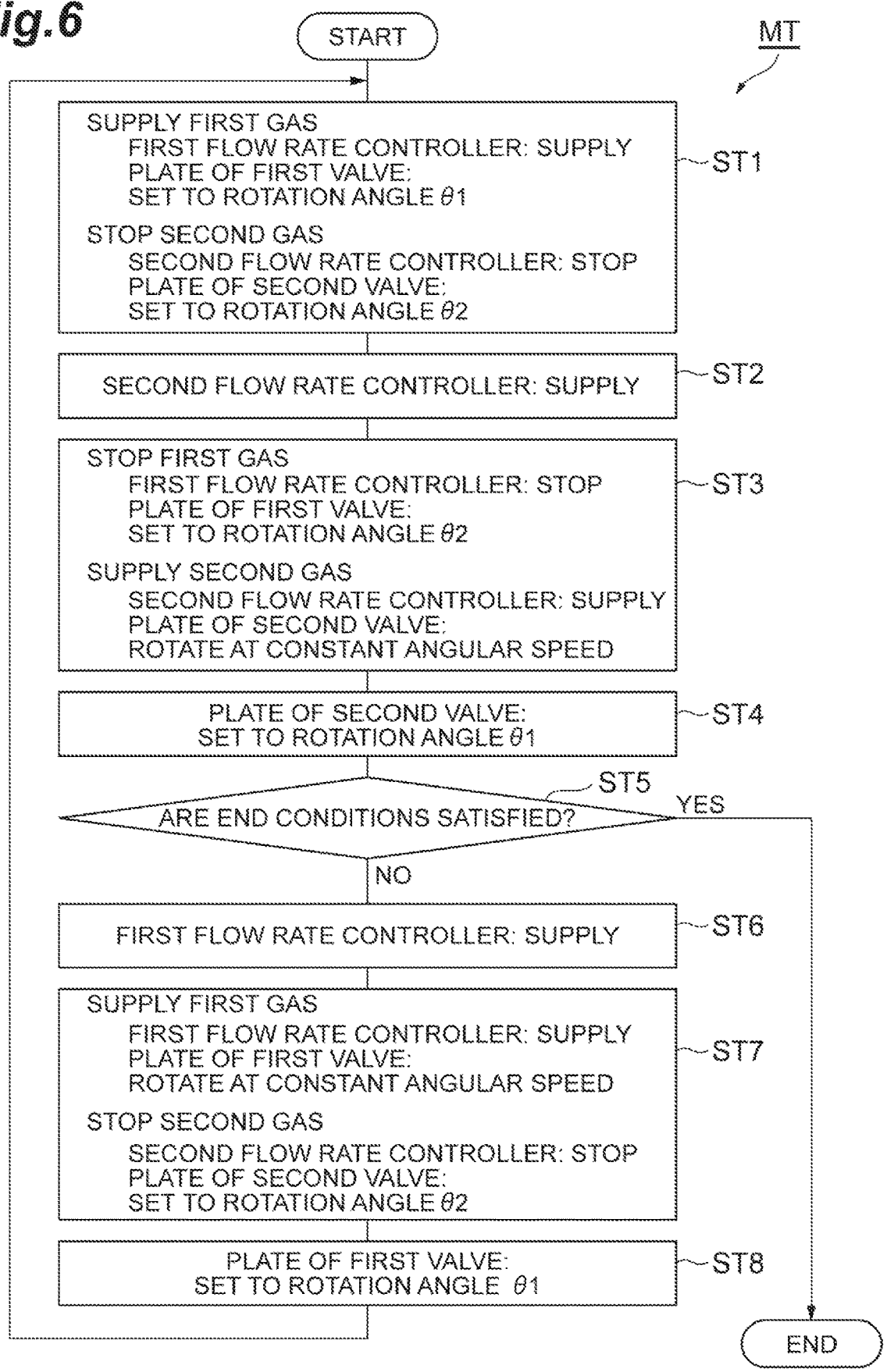
FIG. 6 is a flowchart showing a gas supply method using a gas supply mechanism according to an embodiment.

Next, the gas supply method using the plasma processing apparatus 10 of FIG. 1 will be described. FIG. 6 is a flowchart showing a gas supply method MT according to an embodiment. In this method MT, the first gas and the second gas are alternately supplied into the processing container 12 via the first gas supply mechanism 1A and the second gas supply mechanism 1B, respectively.

In the method MT, first, a step ST1 is performed. In the step ST1, the first gas is supplied to the processing container 12, and supply of the second gas is stopped. Accordingly, the main control unit 65 transmits a control signal to the gas control unit 67. If the gas control unit 67 receives this control signal, the gas control unit 67 controls the first flow rate controller FC1 such that the first gas is supplied to the first pipe 42 and controls the second flow rate controller FC2 such that the supply of the second gas with respect to the second pipe 44 is stopped.

In the step ST1, the main control unit 65 also transmits a control signal to the motor control unit 69. If the motor control unit 69 receives this control signal, the motor control unit 69 controls the motor M1 of the first valve VL1 such that the plate 62 of the first valve VL1 becomes the first rotation angle θ1. In addition, the motor control unit 69 controls the motor M1 of the second valve VL2 such that the plate 62 of the second valve VL2 becomes the second rotation angle θ2. That is, the motor control unit 69 sets the mode of the first valve VL1 to the first operation mode and sets the mode of the second valve VL2 to the second operation mode.

According to the above-described controls, in the step ST1, the first gas is supplied from the first gas source GS1 to the first pipe 42. In addition, after the first gas passes through the first valve VL1 and is diffused in the first gas diffusion chamber 38a, the first gas is supplied to the processing container 12. Meanwhile, the supply of the second gas from the second gas source GS2 is stopped by the second flow rate controller FC2. In addition, the workpiece W is processed using the first gas which is supplied into the processing container 12. For example, plasma of the first gas is generated in the processing container 12 and the workpiece W is etched.

In the method MT, subsequently, a step ST2 is performed. In the step ST2, the main control unit 65 transmits a control signal to the gas control unit 67. If the gas control unit 67 receives this control signal, the gas control unit 67 controls the second flow rate controller FC2 such that the second gas is supplied to the second pipe 44. In this case, since the second valve VL2 is set to the second operation mode in the step ST1, the second gas from the second gas source GS2 remains in the upstream portion 44a of the second pipe 44. Accordingly, in the step ST2, the internal pressure of the upstream portion 44a of the second pipe 44 increases.

Subsequently, a step ST3 is performed. In the step ST3, the gas which is supplied to the processing container 12 is switched from the first gas to the second gas. For this, the main control unit 65 transmits a control signal to the gas control unit 67. If the gas control unit 67 receives this control signal, the gas control unit 67 controls the first flow rate controller FC1 such that the supply of the first gas with respect to the first pipe 42 is stopped. In addition, the gas control unit 67 controls the second flow rate controller FC2 such that the second gas is supplied to the second pipe 44.

In the step ST3, the main control unit 65 also transmits a control signal to the motor control unit 69. If the motor control unit 69 receives this control signal, the motor control unit 69 controls the motor M1 of the first valve VL1 such that the rotation angle of the plate 62 of the first valve VL1 becomes θ2. In addition, the motor control unit 69 controls the motor M1 of the second valve VL2 such that the plate 62 of the second valve VL2 rotates at a constant angular speed. That is, the motor control unit 69 sets the first valve VL1 to the second operation mode and sets the operation mode of the second valve VL2 to the fourth operation mode.

According to the above-described control, in the step ST3, the supply of the first gas into the processing container 12 is stopped by the first flow rate controller FC1 and the first valve VL1. Meanwhile, since the conductance of the second gas supply path is periodically changed, the second gas from the second gas source GS2 is intermittently supplied into the processing container 12. Here, in the step ST2, since a pressure difference is generated between the upstream portion 44a of the second pipe 44 and the processing space S, the gas pressure inside the processing container 12 is stabilized in a short period of time by intermittently supplying the second gas into the processing container 12.

Subsequently, a step ST4 is performed. For example, after the pressure of the second gas inside the processing container 12 is stabilized in the step ST3, the step ST4 is performed. In the step ST4, the main control unit 65 transmits a control signal to the motor control unit 69. If the motor control unit 69 receives this control signal, the motor control unit 69 controls the motor M1 of the second valve VL2 such that the plate 62 of the second valve VL2 becomes the first rotation angle θ1. Accordingly, the second gas from the second gas source GS2 is continuously supplied into the processing container 12. In addition, in the step ST4, in order to adjust the flow rate of the second gas supplied into the processing container 12, the plate of the second valve VL2 may be set to the third rotation angle θ3.

Subsequently, a step ST5 is performed. In the step ST5, it is determined whether or not end conditions are satisfied. For example, whether or not end conditions are satisfied may be determined according to whether or not the number of switching times of the gas supplied to the processing space S reaches a preset number of times. In a case where it is determined that the end conditions are satisfied in the step ST5, the method MT ends. Meanwhile, in a case where it is determined that the end conditions are not satisfied in the step ST5, a step ST6 is performed.

In the step ST6, a control signal is transmitted from the main control unit 65 to the gas control unit 67. If the gas control unit 67 receives this control signal, the gas control unit 67 controls the first flow rate controller FC1 such that the first gas is supplied to the first pipe 42. In this case, since the first valve VL1 is set to the second operation mode in the step ST3, the first gas from the first gas source GS1 remains in the upstream portion 42a of the first pipe 42. Accordingly, in the step ST6, the internal pressure of the upstream portion 42a of the first pipe 42 increases.

Subsequently, a step ST7 is performed. In the step ST7, the gas supplied into the processing container 12 is switched from the second gas to the first gas. For this, the main control unit 65 transmits a control signal to the gas control unit 67. If the gas control unit 67 receives this control signal, the gas control unit 67 controls the first flow rate controller FC1 such that the first gas is supplied to the first pipe 42. Moreover, the gas control unit 67 controls the second flow rate controller FC2 such that the supply of the second gas with respect to the second pipe 44 is stopped.

Moreover, in the step ST7, the main control unit 65 also transmits a control signal to the motor control unit 69. If the motor control unit 69 receives this control signal, the motor control unit 69 controls the motor M1 of the first valve VL1 such that the plate 62 of the first valve VL1 rotates at a constant angular speed. In addition, the motor control unit 69 controls the motor M1 of the second valve VL2 such that the plate 62 of the second valve VL2 becomes the second rotation angle θ2. That is, the motor control unit 69 sets the operation mode of the first valve VL1 to the fourth operation mode, and sets the operation mode of the second valve VL2 to the second operation mode.

According to the above-described control, in the step ST7, the supply of the second gas into the processing container 12 is stopped by the second flow rate controller FC2 and the second valve VL2. Meanwhile, since the conductance of the first gas supply path is periodically changed, the first gas from the first gas source GS1 is intermittently supplied into the processing container 12. Here, in the step ST6, since the pressure difference between the upstream portion 42a of the first pipe 42 and the processing space S is generated, it is possible to stabilize the gas pressure inside the processing container 12 in a short period of time by intermittently supplying the first gas into the processing container 12.

Subsequently, a step ST8 is performed. For example, after the pressure of the first gas inside the processing container 12 is stabilized in the step ST7, the step ST8 is performed. In the step ST8, the main control unit 65 transmits a control signal to the motor control unit 69. If the motor control unit 69 receives this control signal, the motor control unit 69 controls the motor M1 of the first valve VL1 such that the plate 62 of the first valve VL1 becomes the first rotation angle θ1. Accordingly, the first gas from the first gas source GS1 is continuously supplied into the processing container 12. In addition, in the step ST8, in order to adjust the flow rate of the first gas supplied into the processing container 12, the plate of the first valve VL1 may be set to the third rotation angle θ3. After the step ST8, the step ST1 is performed again.

As described above, in the method MT, the first gas and the second gas are alternately supplied into the processing container 12. Immediately after the gas supplied into the processing container 12 is switched from the first gas to the second gas, the pressure difference between the inside of the second pipe 44 and the inside of the processing container 12 is generated, and thereafter, the second gas is intermittently supplied into the processing container 12. On the other hand, immediately after the gas supplied into the processing container 12 is switched from the second gas to the first gas, the pressure difference between the inside of the first pipe 42 and the inside of the processing container 12 is generated, and thereafter, the first gas is intermittently supplied into the processing container 12. Accordingly, when the gas to be supplied is switched, the gas pressure inside the processing container 12 can be early stabilized. Therefore, according to the method MT, since it is possible to shorten a time required for switching the gas, it is possible to improve processing throughput of the workpiece W.

It should be noted that the above-described first valve VL1 and second valve VL2 are not limited to the embodiments. Hereinafter, a valve according to another embodiment will be described.

Figure 7:
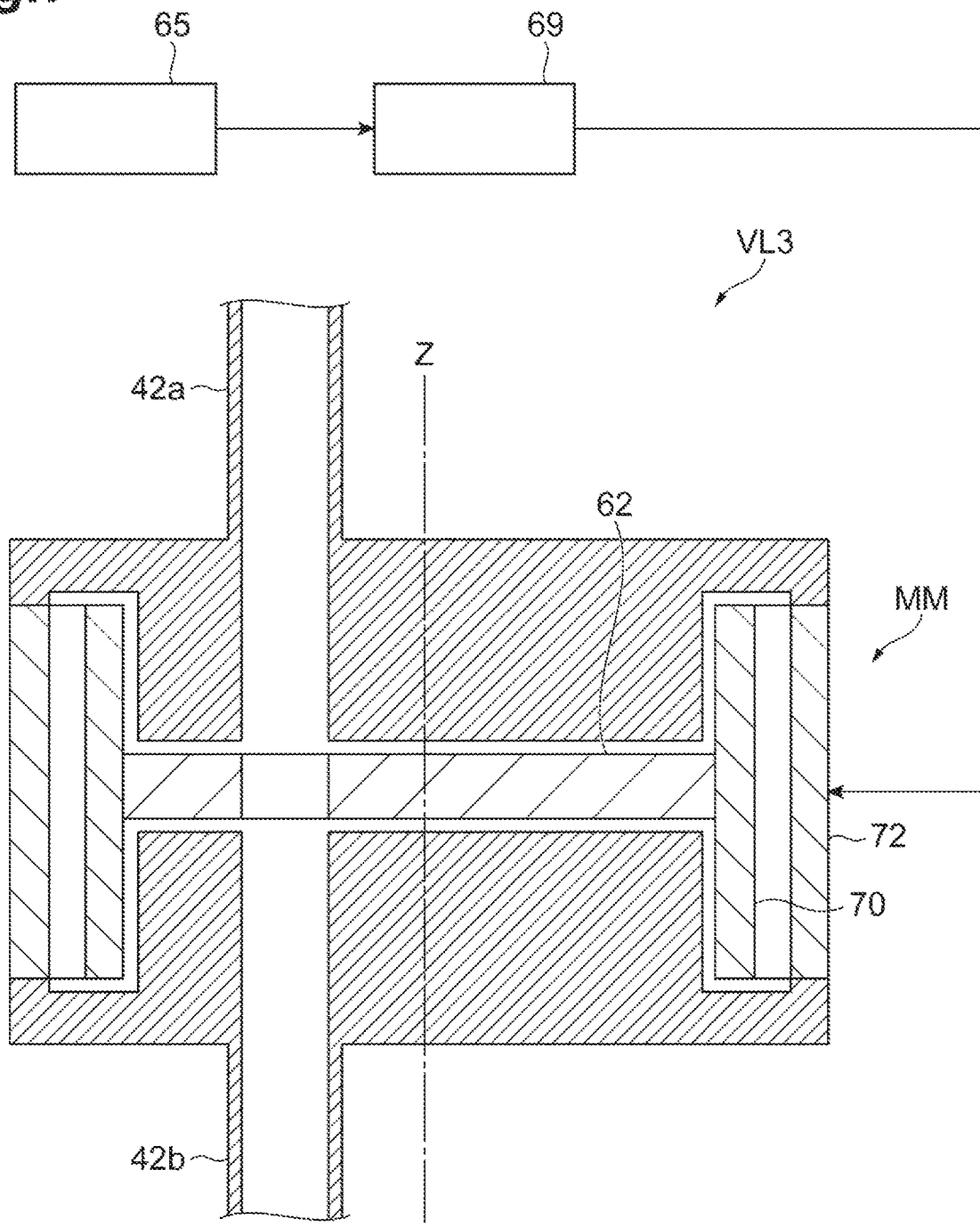
FIG. 7 is a sectional view schematically showing a valve according to another embodiment.

FIG. 7 is a sectional view schematically showing a valve according to another embodiment. A valve VL3 shown in FIG. 7 is different from the above-described first valve VL1 and second valve VL2 in that a hollow motor is used as the motor which rotates the plate 62 around the axis Z.

The valve VL3 includes a hollow motor MM instead of the motor M1. The hollow motor MM includes a tubular stator 72 which has the axis Z as a center axis and a tubular rotor 70 which is provided to be coaxial with the stator 72 inside the stator 72. The rotor 70 and the stator 72 are disposed so as to surround the first pipe 42. In the valve VL3, the plate 62 is provided inside the inner hole of the rotor 70 and is connected to the rotor 70. The rotor 70 rotates around the axis Z. Accordingly, the plate 62 rotates about the axis Z along with the rotor 70.

Similarly to the above-described motor M1, the motor control unit 69 is connected to the hollow motor MM. The hollow motor MM can control the rotation angle of the plate 62 by the control signal from the motor control unit 69. The motor control unit 69 can switch the operation mode of the valve VL3 to any one operation mode of the above-described first to fourth operation modes by controlling the hollow motor of the valve VL3.

Similarly to the above-described first valve VL1 and second valve VL2, the valve VL3 has the function which increases and decreases the conductance of the gas supply path. In addition, in the valve VL3, since it is not necessary to insert the output shaft of the motor into the housing, it is possible to improve sealability.

Next, a valve according to still another embodiment will be described.

Figure 8:
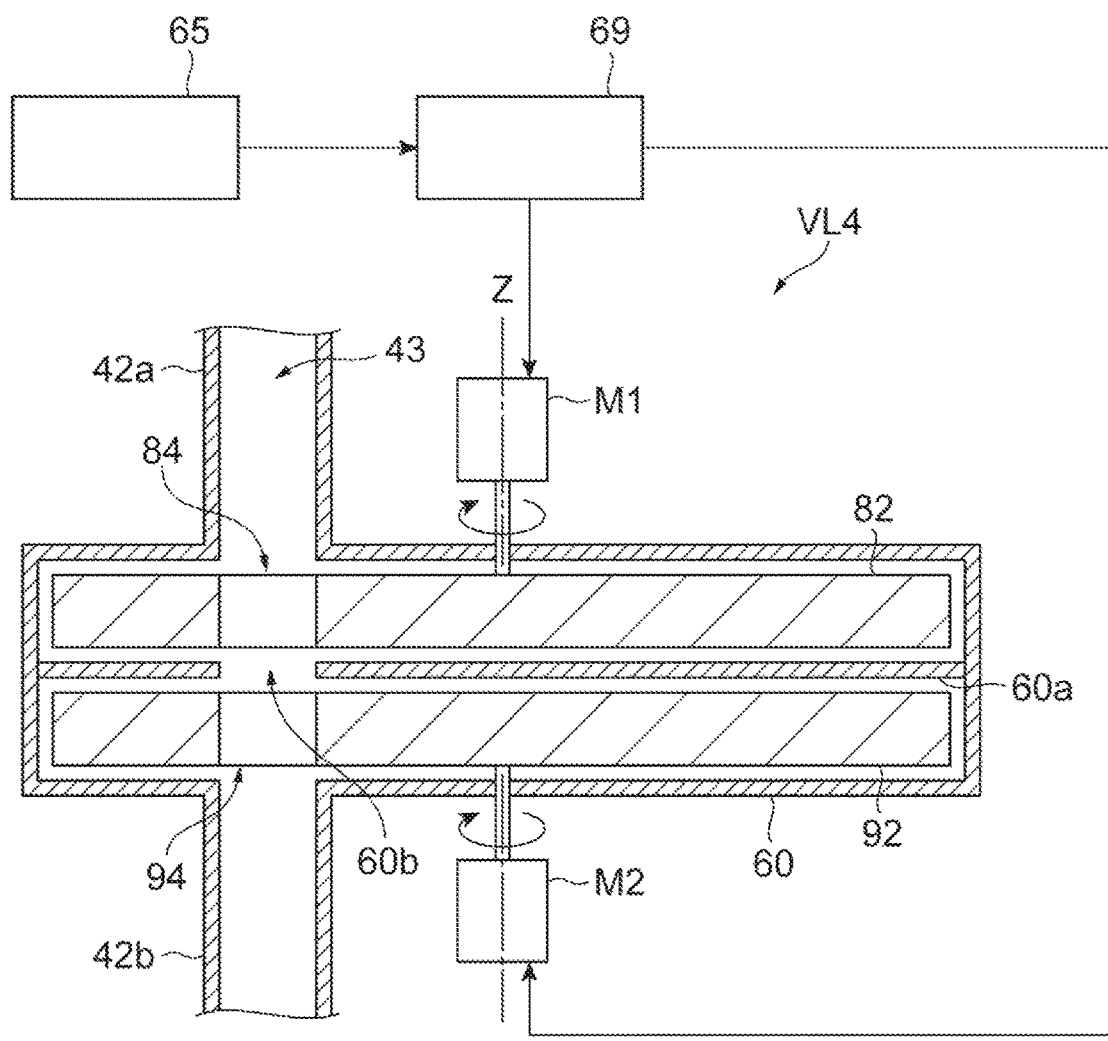
FIG. 8 is a sectional view schematically showing a valve according to still another embodiment.

FIG. 8 is a sectional view schematically showing a valve VL4 according to still another embodiment. The valve VL4 shown in FIG. 8 is different from the above-described first valve VL1 and second valve VL2 in that a plurality of plates are provided inside the housing.

In the valve VL4, a first plate 82 and a second plate 92 are provided inside the housing 60. The first plate 82 and the second plate 92 will be described with reference to FIG. 9.

Figure 9A:
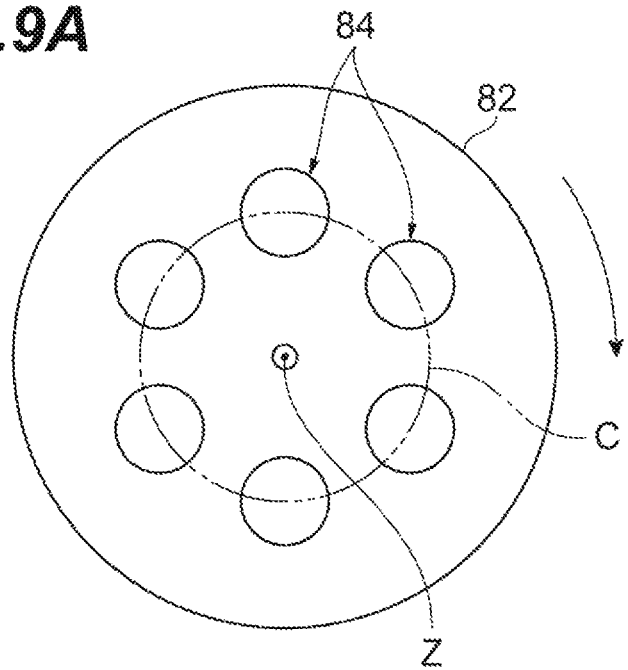
FIG. 9 is a plan view of a first plate and a second plate.
Figure 9B:
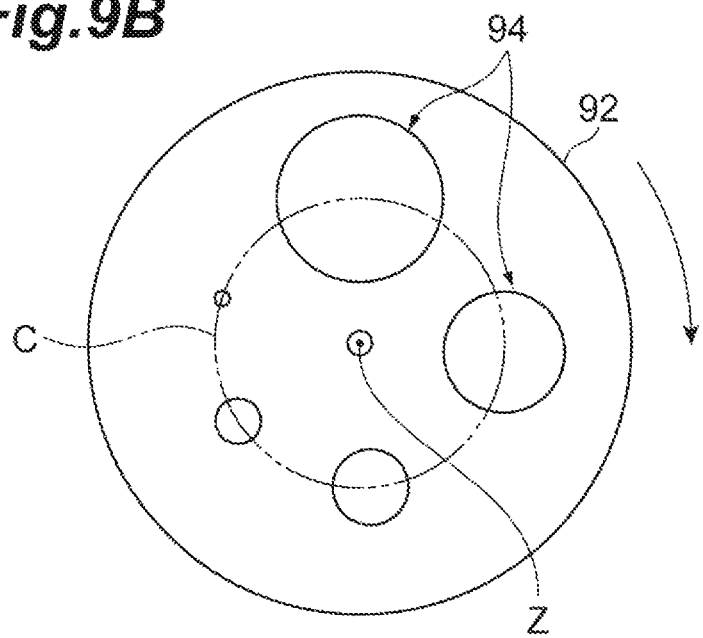

The FIG. 9A is a plan view of the first plate 82 and FIG. 9B is a plan view of the second plate 92. In the first plate 82, a plurality of through holes 84 which extend around the axis Z and penetrate the first plate 82 at positions along the circumference C intersecting the gas supply path 43 are formed. The plurality of through holes 84 are circles which have the same diameter as each other. In addition, as shown in FIG. 8, the motor M1 is connected to the first plate 82. The output shaft of the motor M1 extends on the axis Z, penetrates the housing 60, and is connected to the rotation center axis of the first plate 82 so as to coincide with the rotation center axis.

Meanwhile, in the second plate 92, a plurality of through holes 94 which extend with the axis Z as a center and penetrate the second plate 92 at positions along the circumference C intersecting the gas supply path 43 are formed. Any one of the plurality of through holes 94 is circle. However, the plurality of through holes 94 have diameters different from each other. As shown in FIG. 8, the motor M2 is connected to the second plate 92. The output shaft of the motor M2 extends on the axis Z, penetrates the housing 60, and is connected to the rotation center axis of the second plate 92 so as to coincide with the rotation center axis.

Moreover, as shown in FIG. 8, a partition plate 60a which extends along the first plate 82 and the second plate 92 is provided between the first plate 82 and the second plate 92. In the partition plate 60a, an opening 60b is formed at a position on the gas supply path 43.

The motor control unit 69 is connected to each of the motors M1 and M2. The motors M1 and M2 can control the rotation angle of the plate 62 by the control signal from the motor control unit 69. The motor control unit 69 can switch the operation mode of the valve VL4 to any one operation mode of the above-described first to third operation modes by controlling the motors M1 and M2 of the valve VL4.

In addition, the motor control unit 69 can control the motor M1 and the motor M2 such that the first plate 82 and the second plate 92 rotate in the same direction or in opposite directions. In a case where the above-described control is performed, when both the through hole 84 of the first plate 82 and the through hole 94 of the second plate 92 are positioned on the gas supply path 43, the conductance of the gas supply path 43 becomes the maximum, and the gas from the gas source is supplied to the processing space S.

Similarly to the above-described first valve VL1 and second valve VL2, the valve VL4 has the function which increases and decreases the conductance of the gas supply path 43. Moreover, in the valve VL4, since the through holes having shapes different from each other or diameters different from each other can be formed in the first plate 82 and the second plate 92, it is possible to accurately control the temporal change of the flow rate of the gas which is supplied to the processing space S.

Moreover, in the valve VL4, if the first plate 82 and the second plate 92 are controlled so as to rotate in opposite directions, it is possible to change the conductance of the gas supply path 43 at a high speed. Moreover, the motor M1 of the valve VL4 may be a high-rotation motor which can rotate at a high speed and the motor M2 may be a high-resolution motor which can control a position with high accuracy. In the above-described configuration, for example, the cross-sectional area of the flow path on the same plane of that of the second plate 92 is adjusted by a high-resolution motor while the first plate 82 is rotated at a high speed by the high-rotation motor, it is possible to adjust the flow rate of the gas supplied to the processing space S with high accuracy while changing the conductance at high speed. In addition, the motor M1 may be a high-resolution motor and the motor M2 may be a high-rotation motor.

Next, a valve according to still another embodiment will be described.

Figure 10:
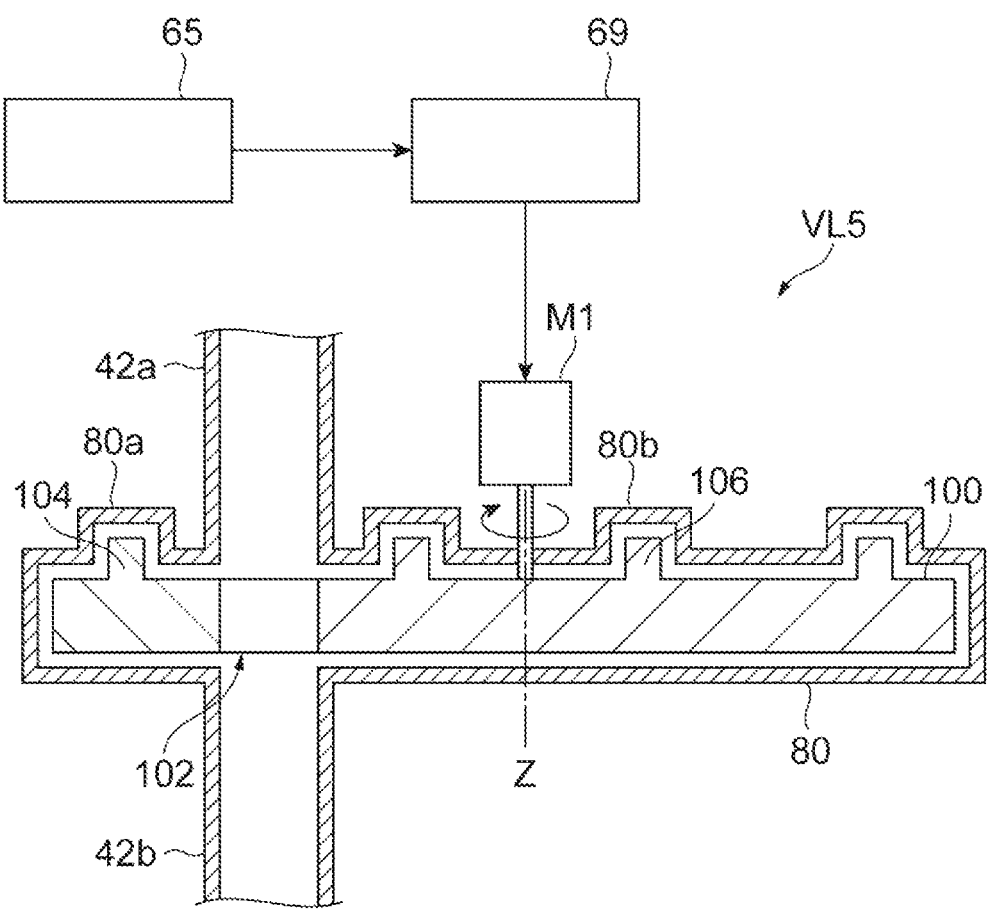
FIG. 10 is a sectional view schematically showing a valve according to still another embodiment.

FIG. 10 is a sectional view schematically showing a valve VL5 according to still another embodiment. The valve VL5 shown in FIG. 10 is different from the above-described first valve VL1 and second valve VL2 in that the valve VL5 has a labyrinth structure for suppressing the gas which flows through the upstream portion 42a of the first pipe 42 from flowing to the downstream portion 42b side of the first pipe 42 via a gap between the housing and the plate.

The valve VL5 includes a plate 100 instead of the plate 62. In the plate 100, a through hole 102 which extends around the axis Z and penetrates the plate 100 at a position on a circumference intersecting the gas supply path is formed. In addition, in the plate 100, protrusions 104 and 106 which protrude in a plate thickness direction are provided. The protrusions 104 and 106 have coaxial annular shapes around the axis Z. The protrusion 104 is provided outside in a radial direction of the plate 100 with respect to the through hole 102 and the protrusion 106 is provided inside in the radial direction of the plate 100 with respect to the through hole 102.

Moreover, the valve VL5 includes a housing 80 instead of the housing 60. In the housing 80, recessed portions 80a and 80b which extend in the plate thickness direction are respectively formed at positions facing the protrusions 104 and 108. The recessed portions 80a and 80b have coaxial annular shapes around the axis Z. The protrusions 104 and 106 are respectively inserted into the recessed portions 80a and 80b.

Similarly to the above-described first valve VL1 and second valve VL2, the valve VL5 has the function which increases and decreases the conductance of the gas supply path. Moreover, since the valve VL5 has the labyrinth structure in which the gap between the housing 80 and the plate 100 is bent at a plurality of times, it is possible to increase the conductance between the housing 80 and the plate 100. As a result, it is possible to prevent the gas which flows through the upstream portion 42a of the first pipe 42 from flowing to the downstream portion 42b side of the first pipe 42 via the gap between the housing and the plate. In an embodiment, the protrusion which protrudes toward the plate may be formed on the housing side and the recessed portion into which the protrusion is inserted may be formed on the plate. Even in this configuration, it is possible to increase the conductance between the housing and the plate.

Hereinbefore, various embodiments are described. However without being limited to the above-described embodiment, various modifications can be configured. For example, in the above-described embodiments, the through hole formed in the plate may have a circular plane shape. However, the plane shape of the through hole is not limited to the circle. For example, the width of the through hole in a direction orthogonal to the axis Z may vary in the circumferential direction with respect to the axis Z. Hereinafter, specific examples will be described.

Figure 11A:
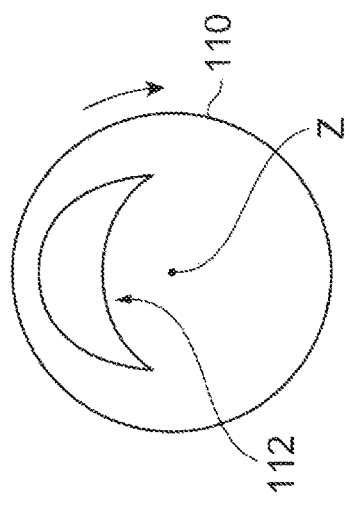
FIG. 11A is a plan view showing a modification example of the plate.
Figure 11B:
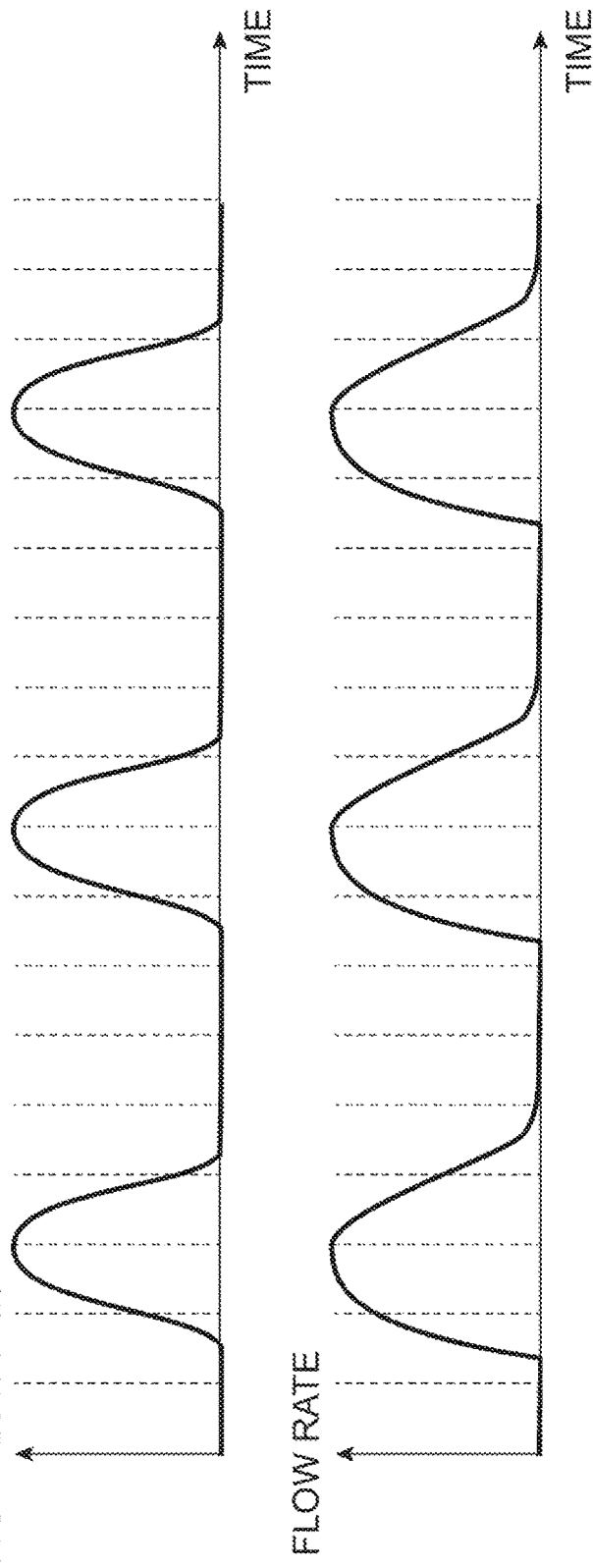
FIG. 11B is a graph showing a temporal change of a cross-sectional area of a flow path on the same plane as that of the plate and a temporal change of a flow rate of a gas supplied to a processing space.

FIG. 11A is a plan view showing a modification example of the plate. In a plate 110 shown in FIG. 11A, a through hole 112 is formed, which has an substantially crescent shape in which the width in the direction orthogonal to the axis Z gradually increases from end portions of the opening portion toward the center portion. In a case where the plate 110 rotates, the temporal change of the cross-sectional area of the flow path on the same plane as that of the plate 110 becomes gentle. Accordingly, as shown in FIG. 11B, it is possible to gently change the flow rate of the gas supplied to the processing space S using the plate 110.

Figure 12A:
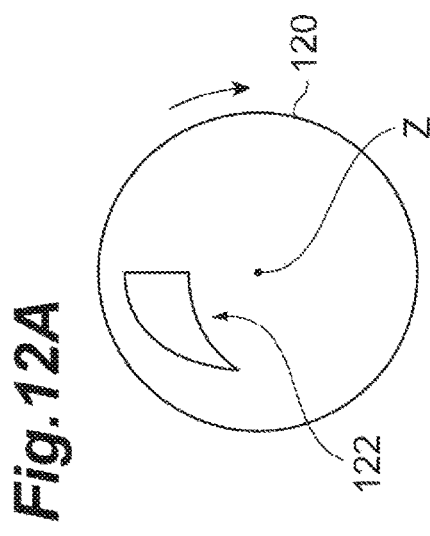
FIG. 12A is a plan view showing an another modification example of the plate.
Figure 12B:
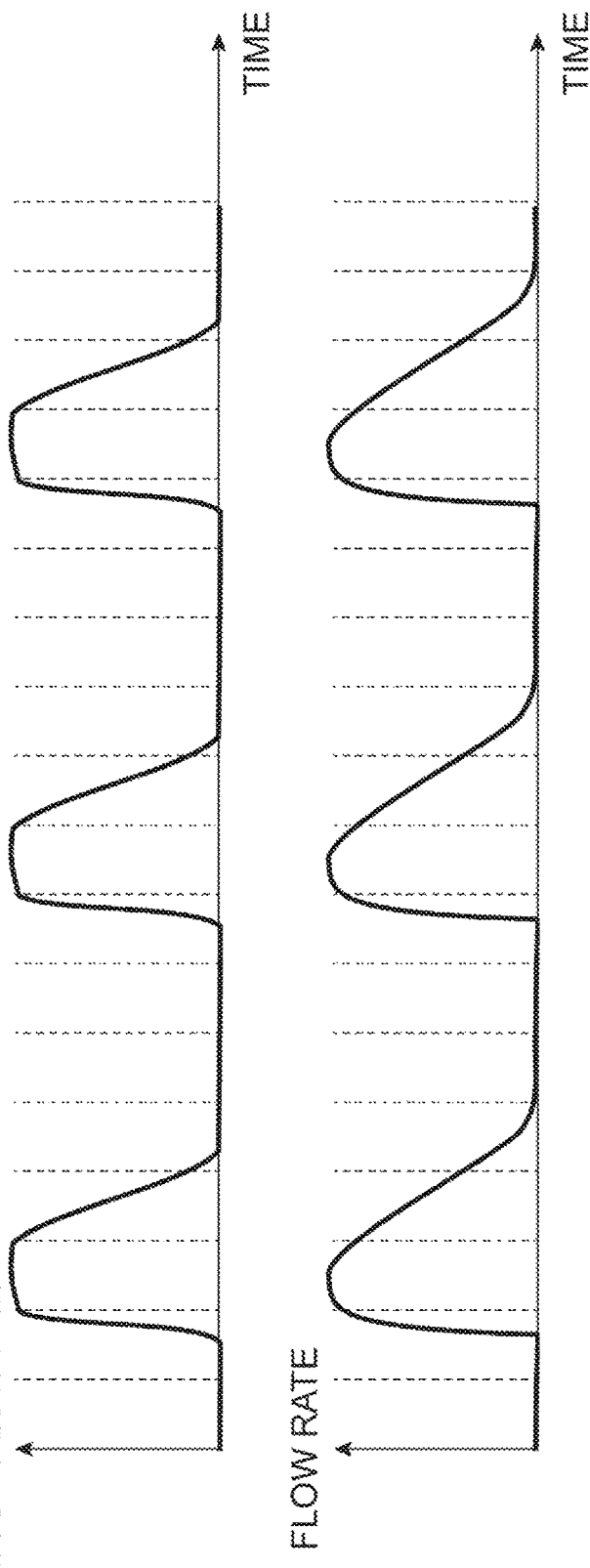
FIG. 12B is a graph showing a temporal change of a cross-sectional area of a flow path on the same plane as that of the plate and a temporal change of a flow rate of a gas supplied to a processing space.

Next, another modification example of the plate will be described. FIG. 12A is a plan view showing another modification example of the plate. In a plate 120 shown in FIG. 12A, a through hole 122 is formed, in which the width in the direction orthogonal to the axis Z becomes the widest width at one end portion on the circumferential direction side of the plate 120 and the width gradually decreases toward the other end portion. In a case where the plate 120 rotates, as shown in FIG. 12B, the temporal change of the cross-sectional area of the flow path on the same plane as that of the plate 120 increases. Accordingly, it is possible to suddenly change the flow rate of the gas supplied to the processing space S using the plate 120.

Figure 13A:
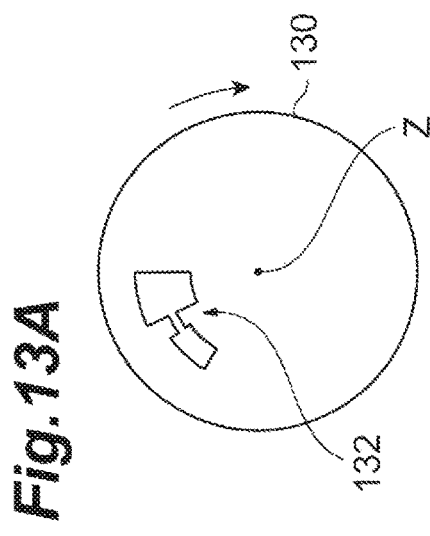
FIG. 13A is a plan view showing a still another modification example of the plate.
Figure 13B:
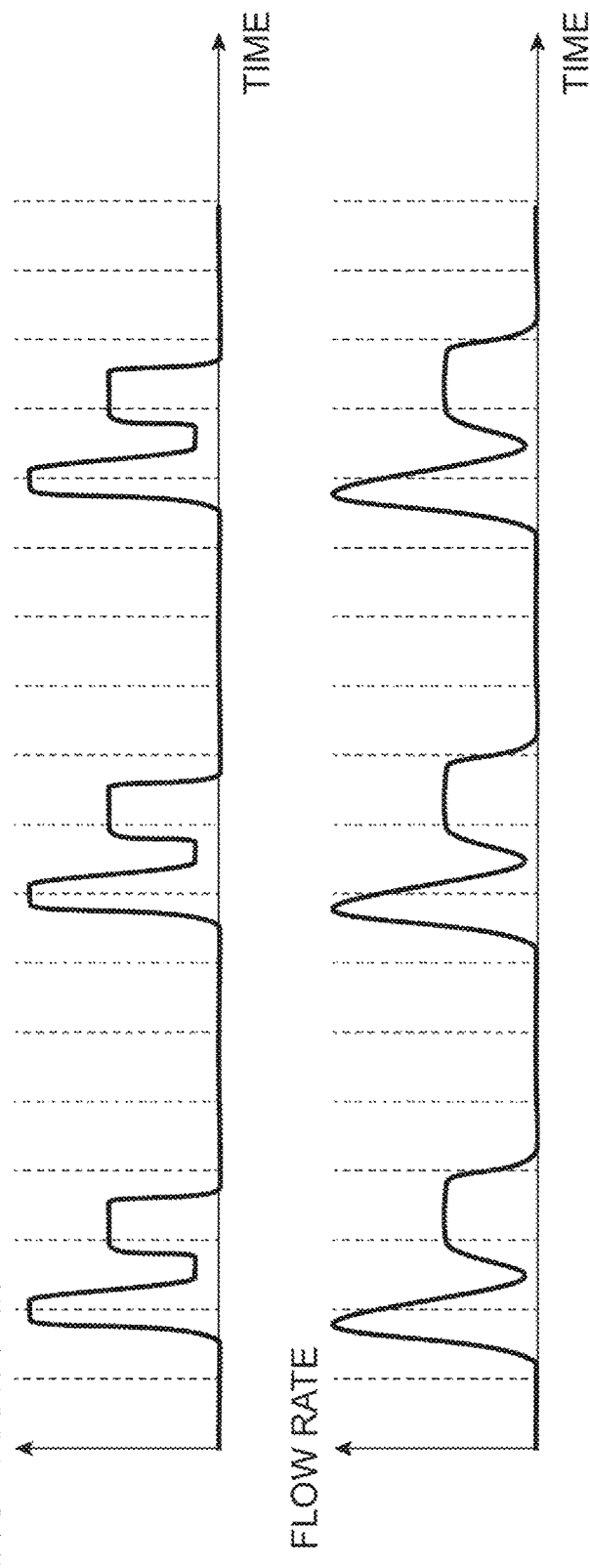
FIG. 13B is a graph showing a temporal change of a cross-sectional area of a flow path on the same plane as that of the plate and a temporal change of a flow rate of a gas supplied to a processing space.
Figure 15A:
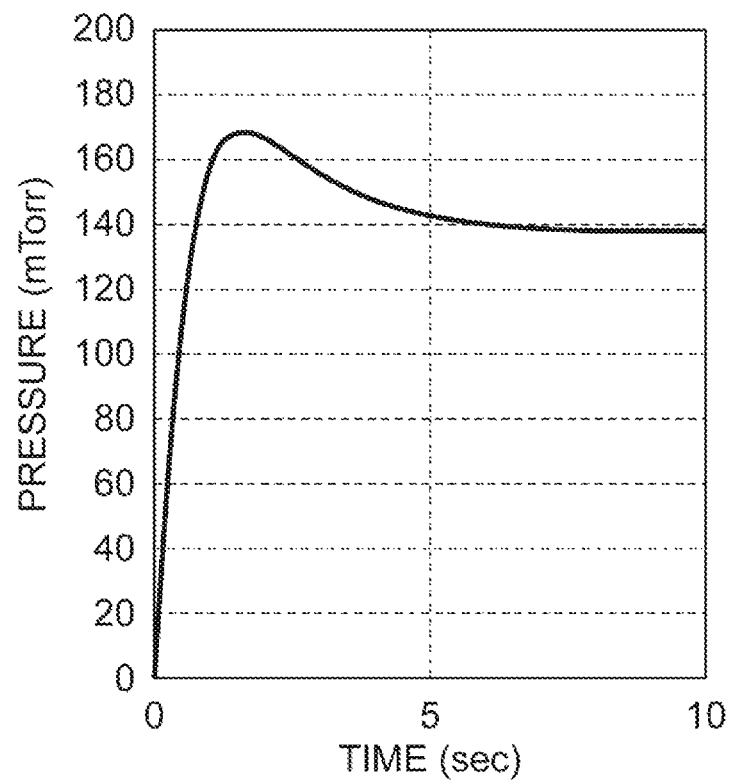
FIG. 15 is a view showing a temporal change of the gas pressure inside the processing space.
Figure 15B:
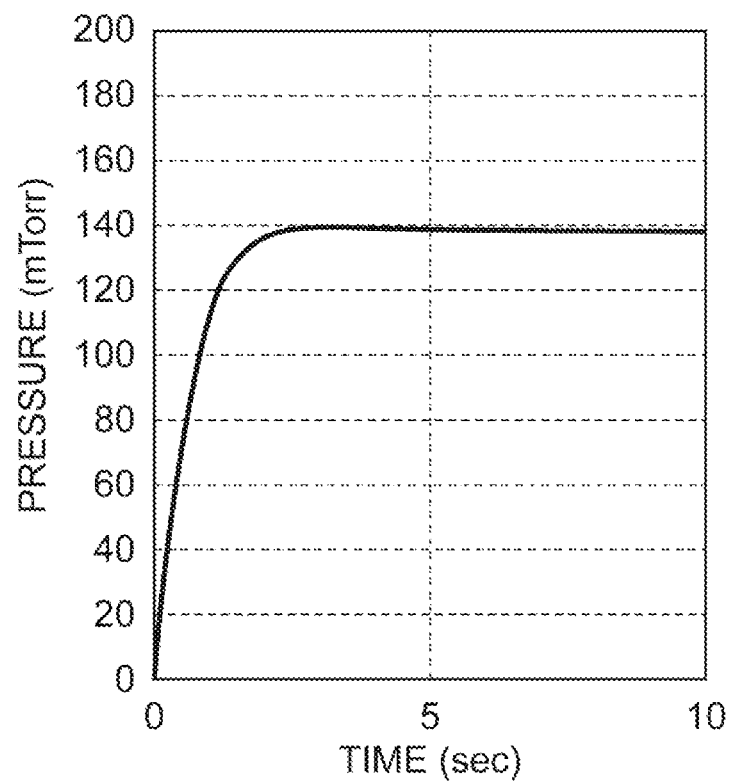

Next, still another modification example of the plate will be described. FIG. 13A is a plan view showing still another modification example of the plate. In a plate 130 shown in FIG. 13A, a through hole 132 is formed, in which the width in the direction orthogonal to the axis Z is changed in stages in order of large, small, and intermediate along the circumferential direction of the plate 130. In a case where the plate 130 rotates in the housing, as shown in FIG. 13B, the cross-sectional area of the flow path on the same plane as that of the plate 130 is changed in stages. Accordingly, it is possible to change the flow rate of the gas supplied to the processing space S in stages. Particularly, as shown in FIG. 13B, it is possible to approximately constantly maintain the gas pressure inside the processing space S by changing the flow rate of the gas supplied to the processing space S in order of large, small, and intermediate.

Next, still another modification example of the plate will be described. FIG. 14A is a plan view showing still another modification example of the plate. In a plate 140 shown in FIG. 14A, a through hole 142 is formed, in which the width in the direction orthogonal to the axis Z is constant in the circumferential direction of the plate 140. In a case where the plate 140 rotates, as shown in FIG. 14B, while the through hole 132 intersects the gas supply path, the cross-sectional area of the flow path on the same plane as that of the plate 140 is constantly maintained. According to this plate 140, it is possible to adjust a duty ratio (a ratio of a time when the supply of the gas is stopped with respect to a supply time of the gas) of the supply and the supply stop of the gas by adjusting the width of the through hole 142 in the circumferential direction. Specifically, as the width of the through hole 132 in the circumferential direction increases, it is possible to increase the duty ratio.

In the above-described embodiments, each of the gas supply mechanisms of various embodiments is applied to a capacity coupling type parallel flat plate plasma etching apparatus. However, the object to which the gas supply mechanism is applied is not limited to the capacity coupling type parallel flat plate plasma etching apparatus. For example, the gas supply mechanism can be applied to a plasma processing apparatus using microwaves, an induction coupling type plasma processing apparatus, and a semiconductor manufacturing apparatus such as a heat treatment device.

Moreover, in the plasma processing apparatus 10 shown in FIG. 1, the first gas diffusion chamber 38a and the second gas diffusion chamber 40a are formed in the electrode support 36. However, a single gas diffusion chamber may be formed in the electrode support 36. In this aspect, the first pipe 42 and the second pipe 44 are combined to each other between the gas diffusion chamber and the valve, and the combined gas supply pipe may be configured to be connected to the gas diffusion chamber.

In addition, the above-described various embodiments can be combined to each other within a range without any contradiction.

REFERENCE SIGNS LIST 1A, 1B . . . gas supply mechanism, 10 . . . plasma processing apparatus, 12 . . . processing container, 34a, 34b . . . gas ejection hole, 38a . . . first gas diffusion chamber, 40a . . . second gas diffusion chamber, 38b, 40b . . . gas communication hole, 42 . . . first pipe, 44 . . . second pipe, 60, 80 . . . housing, 62, 82, 92, 100, 120, 130 . . . plate, 64, 84, 92, 94, 102, 112, 122, 132 . . . through hole, 65 . . . main control unit, 66 . . . output shaft, 67 . . . gas control unit, 69 . . . motor control unit, 70 . . . rotor, 72 . . . stator, 80a . . . recessed portion, 104, 106 . . . protrusion, Cnt . . . control unit, M1, M2 . . . motor, MM . . . hollow motor, S . . . processing space, VL1 . . . first valve, VL2 . . . second valve, VL3, VL4, VL5 . . . valve, W . . . workpiece, Z . . . axis

The invention claimed is:

1. A gas supply mechanism for supplying a gas to a semiconductor manufacturing apparatus, comprising:
   a pipe connecting a gas source and the semiconductor manufacturing apparatus; and
   a valve provided on the pipe, wherein
   the valve includes
      a plate rotatable about an axis, the axis extending in a plate thickness direction, and
      a housing provided along the plate without contacting the plate to accommodate the plate, the housing providing a gas supply path along with the pipe,
   a through hole is formed in the plate, the through hole penetrating the plate at a position on a circle which extends around the axis and intersects the gas supply path, and the through hole is configured to move, by changing a rotation angle of the plate, between a first position, which overlaps with the gas supply path when viewed from a direction along the axis, and a second position, which does not overlap with the gas supply path when viewed from a direction along the axis.

2. The gas supply mechanism according to claim 1, further comprising:
a drive unit configured to rotate the plate; and
a control unit configured to control the drive unit to control a rotation angle of the plate.

3. The gas supply mechanism according to claim 2, wherein
the drive unit includes a motor configured to rotate the plate, and
the motor includes an output shaft, the output shaft extending on the axis and being connected to the plate.

4. The gas supply mechanism according to claim 3, wherein
the output shaft of the motor penetrates the housing and is connected to the plate, and
a seal member is provided between the output shaft and the housing.

5. The gas supply mechanism according to claim 2, wherein
the drive unit includes
a tubular stator, and
a tubular rotor provided coaxially with the stator inside the stator, and
the plate is provided in an inner hole of the rotor and is connected to the rotor.

6. The gas supply mechanism according to claim 1, wherein
a width of the through hole in a direction orthogonal to the axis varies in a circumferential direction with respect to the axis.

7. A semiconductor manufacturing apparatus comprising the gas supply mechanism according to claim 1.

8. The gas supply mechanism according to claim 1, wherein
the valve further includes a second plate rotatable about the axis and accommodated in the housing, and at least one through hole penetrating the second plate at a position on the circle is formed in the second plate.

9. The gas supply mechanism according to claim 8, wherein
a plurality of through holes are formed in the second plate, the plurality of through holes having diameters different from each other.

10. The gas supply mechanism according to claim 8, further comprising a second drive unit configured to rotate the second plate, wherein
the control unit is configured to control the second drive unit to control a rotation angle of the second plate.

11. The gas supply mechanism according to claim 10, wherein
the control unit is configured to control the drive unit and the second drive unit so that the first plate and the second plate rotate in opposite directions.

12. The gas supply mechanism according to claim 8, wherein
the housing includes a partition plate disposed between the plate and the second plate, and
an opening is formed in the partition plate at a position on the gas supply path.

13. The gas supply mechanism according to claim 1, wherein
the plate comprises an armular protrusion which protrudes in a plate thickness direction, and
the housing comprises an armular recessed portion formed at a position facing the protrusion so that the protrusion is inserted into the recess portion.

* * * * *